(12) United States Patent
Naitou

(10) Patent No.: US 7,569,987 B2
(45) Date of Patent: Aug. 4, 2009

(54) LIGHT EMITTING APPARATUS

(75) Inventor: Takahiro Naitou, Anan (JP)

(73) Assignee: Nichia Corporation, Anan-shi (JP)

( * ) Notice: Subject to any disclaimer, the term of this patent is extended or adjusted under 35 U.S.C. 154(b) by 54 days.

(21) Appl. No.: 11/213,860

(22) Filed: Aug. 30, 2005

(65) Prior Publication Data

US 2006/0043879 A1 Mar. 2, 2006

(30) Foreign Application Priority Data

Aug. 31, 2004 (JP) .......................... P 2004-253142

(51) Int. Cl.
*H01J 1/62* (2006.01)
(52) U.S. Cl. .................. 313/503; 313/499; 313/501; 313/512
(58) Field of Classification Search ................ 315/246; 313/498–512
See application file for complete search history.

(56) References Cited

U.S. PATENT DOCUMENTS

| 6,577,073 | B2 | 6/2003 | Shimizu et al. | |
| 6,639,360 | B2 * | 10/2003 | Roberts et al. | 313/512 |
| 7,005,667 | B2 * | 2/2006 | Chen et al. | 257/14 |
| 7,005,679 | B2 * | 2/2006 | Tarsa et al. | 257/89 |
| 2003/0038295 | A1 * | 2/2003 | Koda | 257/98 |
| 2003/0227023 | A1 * | 12/2003 | Chang et al. | 257/89 |
| 2004/0135504 | A1 * | 7/2004 | Tamaki et al. | 313/512 |

FOREIGN PATENT DOCUMENTS

| JP | 2000-349345 A | 12/2000 |
| JP | 2001-222904 | 8/2001 |
| JP | 2002-217454 A | 8/2002 |
| JP | 2002217454 A * | 8/2002 |
| JP | 2004-80046 A | 3/2004 |

* cited by examiner

*Primary Examiner*—Nimeshkumar D. Patel
*Assistant Examiner*—Anne M Hines
(74) *Attorney, Agent, or Firm*—Birch, Stewart, Kolach & Birch, LLP

(57) ABSTRACT

An object of the present invention is to provide a light emitting apparatus that allows it to easily control the driving of LED and has high color rendering properties.

The light emitting apparatus comprises the first light emitting device 108a that has first peak emission wavelength in blue region and emits blue light, the fluorescent material 140 that is excited by the light from the first light emitting device 108a and emits red light, the second light emitting device 108b that has second peak emission wavelength which is longer than the first peak emission wavelength and is shorter than peak emission wavelength of the fluorescent material 140, and the second light emitting device 108b that emits green light of second peak emission wavelength which is longer than the first peak emission wavelength, so as to emit light generated by blending of blue light, green light and red light to the outside.

7 Claims, 14 Drawing Sheets

LIGHT EMITTING APPARATUS

BACKGROUND OF THE INVENTION

1. Field of the Invention

The present invention relates to a light emitting apparatus used as backlight source for liquid crystal, illumination apparatus, light source for computer display, flash light for camera, ancillary light source for movie picture or the like.

2. Description of the Related Art

Cold cathode ray fluorescent tubes (CCFL) are currently used as the backlight source for the liquid crystal display of apparatuses other than mobile apparatus. However, it is strongly called for to replace the CCFL with light sources that do not use mercury, in order to avoid adverse effect on the environment. A light emitting apparatus that uses a light emitting device (hereinafter referred to as LED, too) receives much attention for that purpose.

A light emitting apparatus using a light emitting device is compact, has high power efficiency and emits light with clear color. The light emitting device is a semiconductor device and therefore never blows out. Moreover, the light emitting device has excellent initial drive characteristic and is highly durable against vibration and repetitive ON/OFF switching operations. Due to these excellent characteristics, the light emitting apparatus using the light emitting device such as light emitting diode or laser diode (hereinafter referred to also as LD) is used as the light source for various applications.

A white light emitting apparatus using LED may be constituted from any of the following three combinations.

First is a light emitting apparatus that combines a blue LED and a so-called YAG fluorescent material that emits yellow light. The light emitting apparatus emits white light by blending blue light and yellow light emitted by the YAG fluorescent material that is excited by the light emitted by the blue LED. This light emitting apparatus is widely used due to its low power consumption, capability to easily control the drive of the LED and capability of satisfactory color blending.

Second is a light emitting apparatus that combines an ultraviolet LED and fluorescent materials. Fluorescent materials that emit blue light, green light and red light are used. The light emitting apparatus produces white light through blending of blue light, green light and red light that are emitted by the fluorescent materials. Since the emission from the ultraviolet LED is hardly visible to the eye, color of the light emitted by the apparatus is determined solely by the light emitted by the fluorescent materials. This light emitting apparatus is capable of easily controlling the drive of the LED and satisfactory color blending.

Third is a light emitting apparatus that combines a blue LED, a green LED and a red LED. This light emitting apparatus is a so-called three-wavelength light emitting apparatus, and emits white light by means of light emitted by the LEDs. This light emitting apparatus has low power consumption and a wide range of colors displayed after passing a liquid crystal.

However, the first light emitting apparatus emits light that is generated by blending blue light and yellow light, and has less red component than the light emitted by the cold cathode ray fluorescent tubes (CCFL).

The second light emitting apparatus uses the ultraviolet LED, and therefore requires measures to prevent ultraviolet ray from leaking to the outside. Since the emission from the ultraviolet LED is hardly visible to the eye, ultraviolet ray that has leaked cannot be used as light and results in low light emitting efficiency.

The third light emitting apparatus is not capable of blending light satisfactorily, and has low color rendering properties. Since the light emitted by the LED is sharp unlike the light emitted by the fluorescent material, the light emitted by the LED is difficult to blend with each other. Also because one light source requires at least three LEDs, it is difficult to control the driving of the LEDs and adjust the color tone.

SUMMARY OF THE INVENTION

With the background described above, the present invention has an object to provide a light emitting apparatus that has low power consumption and a wide range of colors displayed after passing a liquid crystal.

In order to solve the problems described above, the inventors of the present application completed the present invention upon intense research.

The present invention has a constitution as described below so as to have effects as described below.

A first light emitting apparatus of the present invention comprises at least a first light emitting device that has a first peak emission wavelength in a short wavelength region of visible light, a fluorescent material that converts light emitted by the first light emitting device to light of a different wavelength and a second light emitting device that has a second peak emission wavelength which is longer than the first peak emission wavelength and is shorter than the peak emission wavelength of the fluorescent material, wherein the light emitted by the first light emitting device, the light emitted by the fluorescent material and the light emitted by the second light emitting device are mixed and emitted to the outside. The first light emitting apparatus has the capability to control the color tone by means of the two LEDs, and thereby to easily control the driving. Also because the fluorescent material that has a broader emission spectrum than that of the LED is used, the light emitting apparatus can blend light of different colors satisfactorily and has high color rendering properties. Also because the visible light emitted by the first light emitting device can be utilized, the light emitting apparatus has high light emitting efficiency and a wide range of colors displayed after passing a liquid crystal.

A second light emitting apparatus of the present invention comprises at least a first light emitting device that has a first peak emission wavelength in ultraviolet region, a fluorescent material that converts light emitted by the first light emitting device to light of a different wavelength and a second light emitting device that has a second peak emission wavelength longer than the first peak emission wavelength, wherein the light emitted by the fluorescent material and the light emitted by the second light emitting device are mixed and emitted to the outside.

The second light emitting apparatus has the capability to control the color tone by means of the two LEDs, and thereby to easily control the driving. Since the ultraviolet LED is used, luminous efficiency is hardly affected when the peak emission wavelength of the ultraviolet LED shifts to shorter wavelengths due to a variation in the input power, thus providing the light emitting apparatus that experiences extremely small color deviation. Also because the color tone is adjusted by blending the light from two light sources, the fluorescent material and the second light emitting device, it is easy to achieve a desired color tone.

A third light emitting apparatus of the present invention comprises at least a first light emitting device that has a first peak emission wavelength, a fluorescent material that converts the light emitted by the first light emitting device to light of a different wavelength and a second light emitting device that has a second peak emission wavelength longer than the first peak emission wavelength, wherein the first light emitting device and the second light emitting device are nitride compound semiconductors that emit light of different colors, and at least two of the light emitted by the first light emitting device, the light emitted by the fluorescent material and the light emitted by the second light emitting device are mixed and emitted to the outside. The expression "light of different colors" notwithstanding, the light emitting device here includes one that emits in the ultraviolet region. That is, the light emitting device that emits in the ultraviolet region does emission, although it cannot be seen, and the emission is regarded as colorless emission in order to distinguish it from the light emitted by the other devices. For example, in case the first light emitting device that emits in the ultraviolet region and the second light emitting device that emits blue light in the visible region are used, the present specification describes it that two distinct emissions, colorless and blue, are produced. By using at least two kinds of light emitting devices of different colors of emission, it is made possible to broaden the range of colors displayed after passing the liquid crystal. Also because the first light emitting device and the second light emitting device experience similar amounts of color deviation caused by a variation in the input power to the light emitting devices that are nitride compound semiconductor, it is easy to adjust the color tone.

In the light emitting apparatus of the present invention, the difference between the first peak emission wavelength and the second peak emission wavelength is preferably 30 nm or larger, more preferably 60 nm or larger. Controllable range of color tone can be increased by increasing the difference between the first peak emission wavelength and the second peak emission wavelength. For example, a light emitting device that emits blue light with a first peak emission wavelength located around 460 nm and a light emitting device that emits green light with a second peak emission wavelength located around 530 nm may be used.

In the light emitting apparatus of the present invention, the fluorescent material is preferably a nitride fluorescent material that contains at least one kind of group II element selected from among a group consisting of Be, Mg, Ca, Sr, Ba and Zn, at least one kind of group IV element selected from among a group consisting of C, Si, Ge, Sn, Ti, Zr and Hf, and element N, and is activated with at least one kind of rare earth element selected from among a group consisting of Y, La, Ce, Pr, Nd, Sm, Eu, Gd, Tb, Dy, Ho, Er and Lu. This fluorescent material converts light emitted by the first light emitting device to light of different wavelength very efficiently. Also a light emitting apparatus having excellent color rendering properties can be provided due to the broad emission spectrum.

The fluorescent material produces such an emission spectrum, when excited by the light from the first light emitting device, as the light intensity preferably consists of 100 parts attributable to the light of the first peak emission wavelength emitted by the first light emitting device and 80 parts attributable to the light of the second peak emission wavelength emitted by the second light emitting device. With this constitution, the fluorescent material is excited mainly by the light emitted by the first light emitting device while being complementarily excited by the light emitted by the second light emitting device.

DETAILED DESCRIPTION OF THE PREFERRED EMBODIMENTS

Now a light emitting apparatus and a method for manufacturing the same according to the present invention will be described below by way of embodiments and examples. It is understood, however, that the present invention is not limited to these embodiments and examples.

In this specification, color names are related to the values of chromaticity coordinates according to the CIE convention, unless otherwise stated.

First Embodiment

Figure 1:
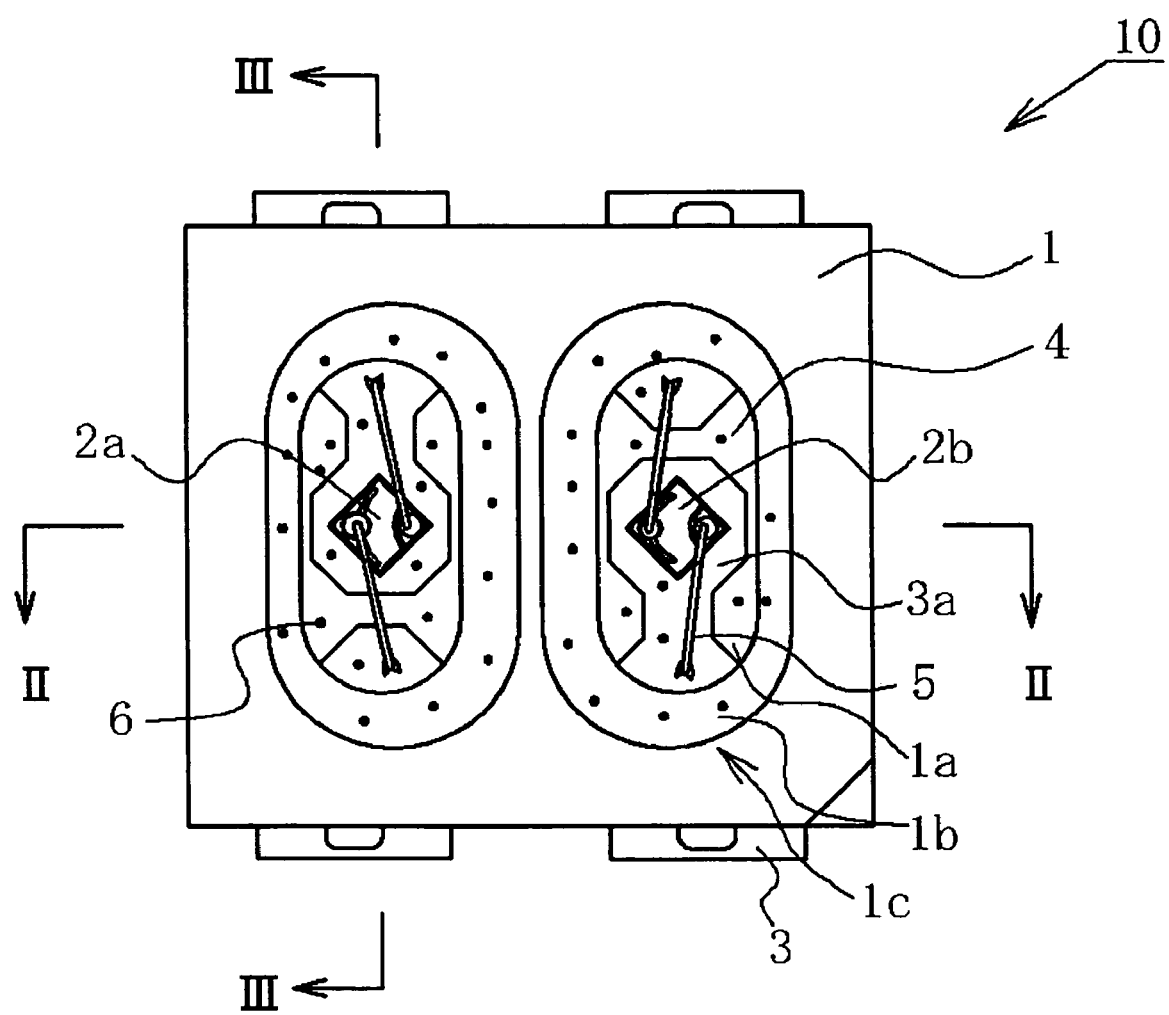
FIG. 1 is a plan view schematically showing the light emitting apparatus of the first embodiment.
Figure 2:
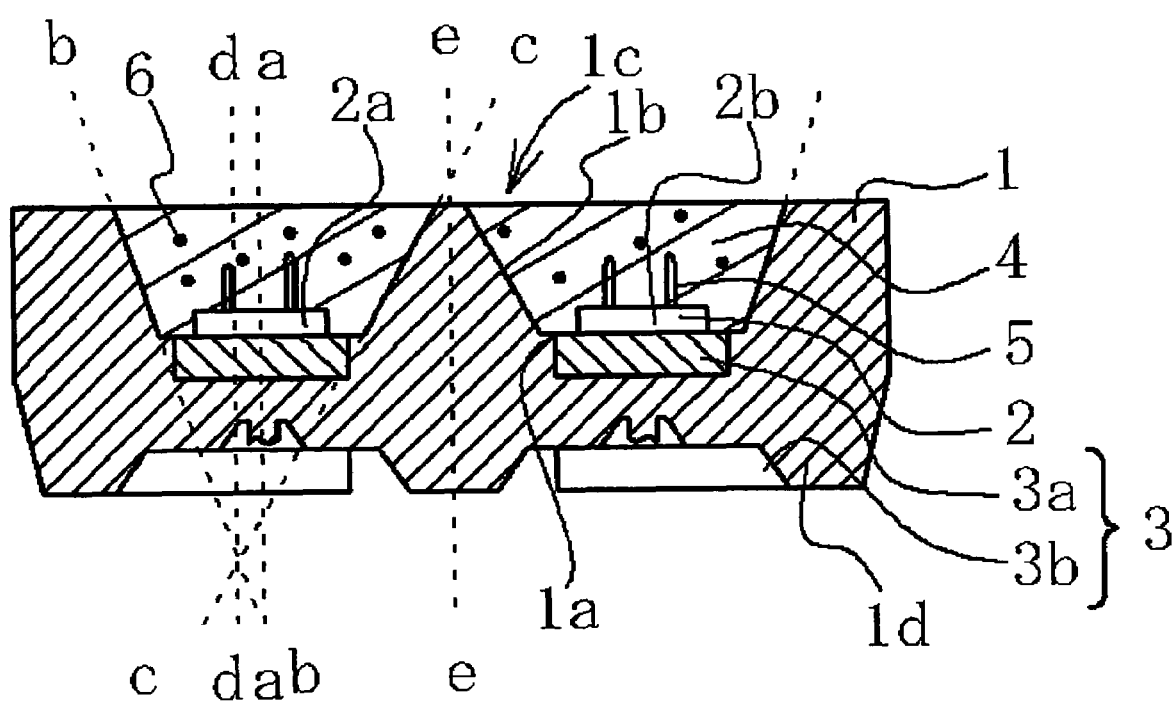
FIG. 2 is a schematic sectional view taken along lines II-II of the light emitting apparatus of the first embodiment.
Figure 3:
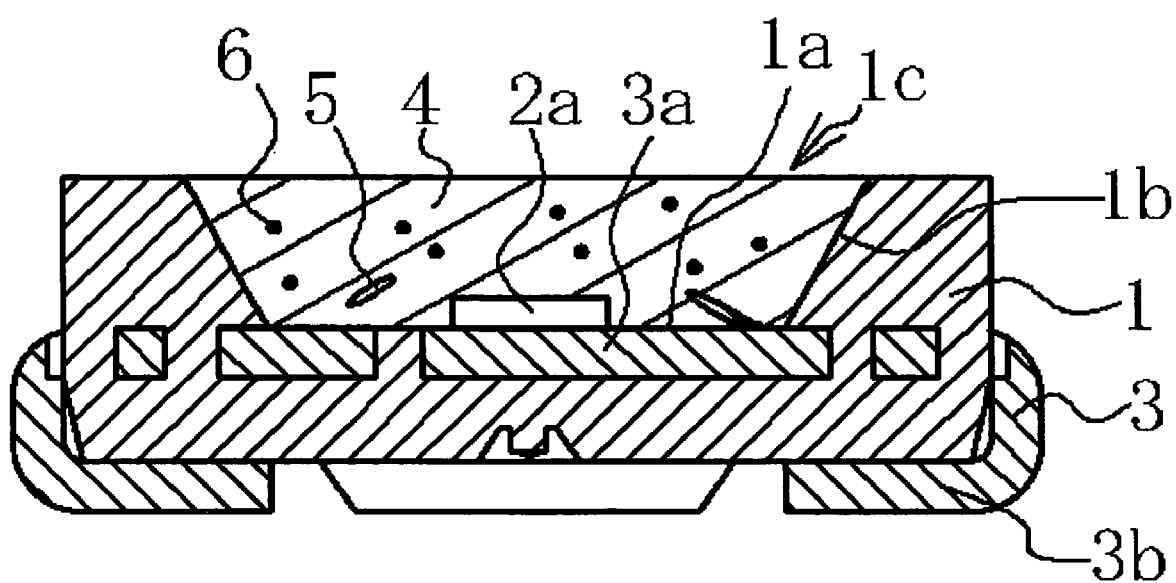
FIG. 3 is a schematic sectional view taken along lines III-III of the light emitting apparatus of the first embodiment.
Figure 4:
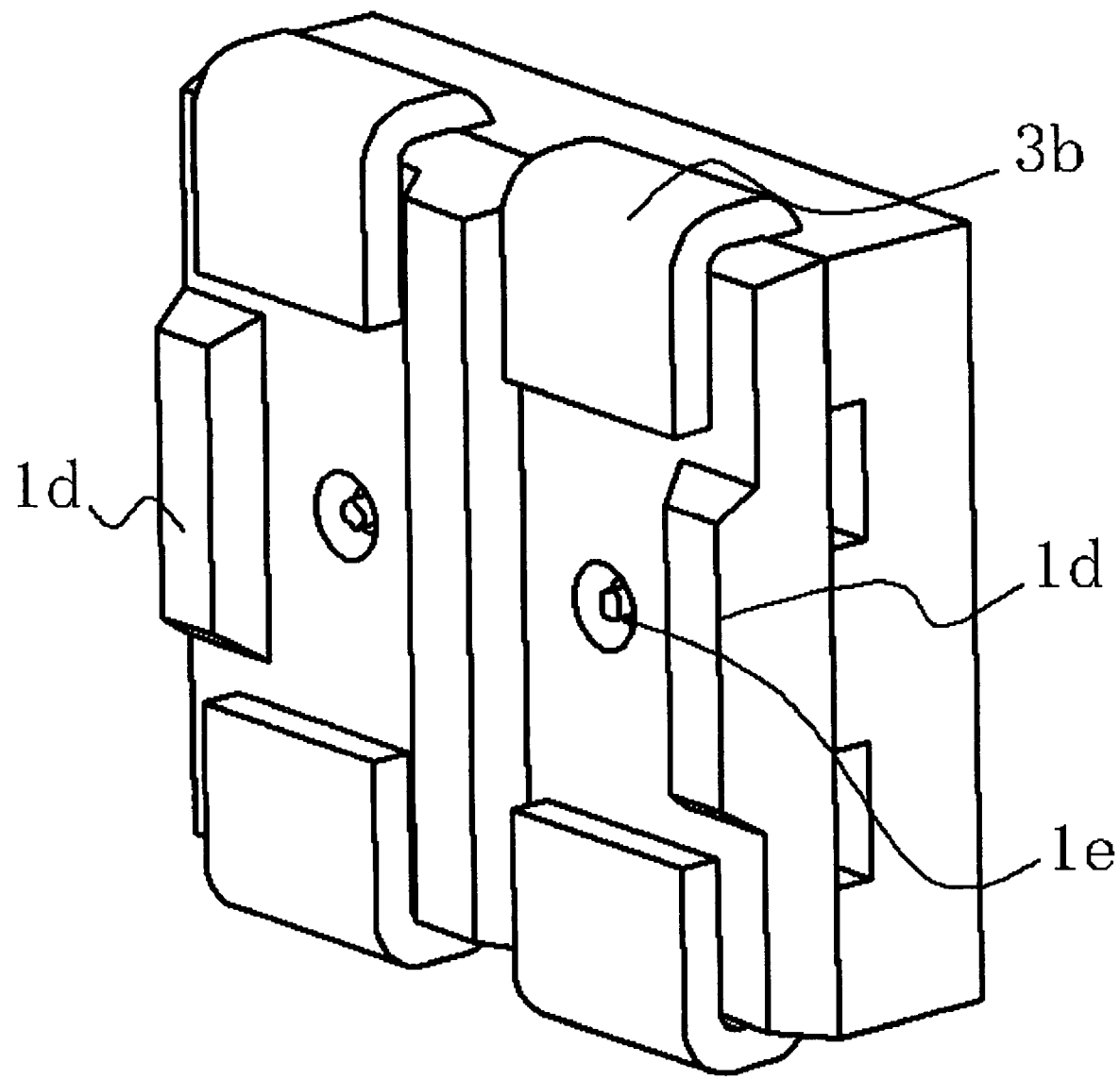
FIG. 4 is a schematic perspective view showing the light emitting apparatus of the first embodiment on the back side thereof.

FIG. 1 is a plan view schematically showing the constitution of the light emitting apparatus of the first embodiment. FIG. 2 is a schematic sectional view taken along lines II-II of FIG. 1. FIG. 3 is a schematic sectional view taken along lines III-III of FIG. 1. FIG. 4 is a schematic perspective view showing the light emitting apparatus of the first embodiment on the back side thereof.

(Light Emitting Apparatus)

The light emitting apparatus 10 of the first embodiment comprises a light emitting device 2 and a package 1 that has two recesses 1c each having a bottom surface 1a where the light emitting device 2 is to be mounted and a side surface 1b extending from the bottom surface 1a. An electrode 3 is provided on the bottom surface 1a of the recess 1c of the package 1, with the light emitting device 2 mounted on a mount 3a of the electrode 3. The light emitting device 2 has a first light emitting device 2a and a second light emitting device 2b, while the first light emitting device 2a is provided in one of the two recesses 1c and the second light emitting device 2b is provided in the other recess 1c.

The light emitting device 2 is made of a material based on GaN, for example, and is made by forming an n-type compound semiconductor layer on an insulating sapphire substrate, and forming a p-type compound semiconductor layer thereon. The light emitting device 2 has the sapphire substrate mounted on the top surface of the electrode 3. An n-side electrode formed on the top surface of the n-type compound semiconductor layer is electrically connected to the electrode 3 by means of a wire 5. A p-side electrode formed on the top surface of the p-type compound semiconductor layer is electrically connected to the electrode 3 by means of the wire 5. The electrode 3 comprises a pair of positive and negative electrodes. The light emitting device 2 may be made of a material based on InGaN, GaP, GsAs or the like, as well as GaN-based material. The light emitting device 2 may be either one that emits blue, green, yellow or red light in the visible region, or one that emits in the ultraviolet or infrared region. The first light emitting device 2a has a first peak emission wavelength in a range from ultraviolet to short wavelength region of the visible light. The second light emitting device 2b has a second peak emission wavelength that is longer than the first peak emission wavelength.

The package 1 has the recess 1c formed to open upward. The recess 1c has the bottom surface 1a where the light emitting device 2 is to be mounted and the side surface 1b extending from the bottom surface 1a. In a section of the package 1 that passes the recess 1c vertically, a line a-a that perpendicularly passes the bottom surface 1a of the recess 1c at the center is offset from a line d-d that perpendicularly passes the bottom surface 1a at the intersect of a first line b-b that extends from one of the side faces 1b of the recess 1c and a second line c-c that extends from the other one of the side faces 1b of the recess 1c. In case the perpendicular line d-d that passes the intersect is located at a position located outside of the perpendicular line a-a that passes the center, light emitted by the light emitting device 2 is mixed at a position near the center of the adjacent recess 1c, thus producing light of a predetermined uniform color. In case the perpendicular line d-d that passes the intersect is located at a position located inside of the perpendicular line a-a that passes the center, light emitted by the light emitting device 2 is mixed at a position near the center of the adjacent recess 1c and emits light with high luminance at a position near the center of the adjacent recess 1c, thus producing light of uniform color with high luminance. It is preferable that a section that vertically passes the two adjacent recesses 1c has symmetrical configuration with respect to a perpendicular line e-e interposed between the two recesses 1c. Provided on the back side of the package 1 is a back side electrode portion 3b that continues from the mount 3a provided on the bottom surface 1a of the recess 1c. Thickness of the back side electrode portion 3b and height of a protrusion 1d provided on the back side of the package 1 are preferably the same when the light emitting apparatus 10 is mounted. By making these at the same height, stability of mounting the light emitting apparatus 10 can be improved. Provided on the back side of the package 1 are two sprue slugs 1e, that are remains of resin injection, as the package 1 is made thinner by providing the plurality of resin injection ports in the die used to mold the package 1. There is no restriction on the configuration of the package 1, and projection of the bottom of the package 1 may be circular, elliptical, rectangular, polygonal or similar shapes. There is no restriction on the size of the package 1 that may be, for example, from 0.1 mm$^2$ to 100 mm$^2$. Thickness of the package 1 may be from 100 μm to 10 mm. There is no restriction on the material used to make the package 1, that may be a known material, typically thermoplastic engineering polymer that is a heat resistant resin, thermosetting resin, or the like, or a combination of the two types. For example, liquid crystal polymer (LCP), polyphenylene sulfide (PPS), aromatic nylon (PPA), epoxy resin, hard silicone resin or the like may be used.

Among these, thermoplastic engineering polymer is preferable for the advantage regarding the cost. These resins may contain inorganic filler such as titanium oxide, zinc oxide, alumina, silica, barium titanate, calcium phosphate, calcium carbonate, white carbon, talc, magnesium carbonate, boron nitride, glass fiber or the like, added individually or in combination of two or more kinds. In addition, additives such as antioxidant, thermal stabilizer, light stabilizer or the like may be added. For example, it is appropriate to add 10 to 80 parts, preferably 40 to 80 parts, of inorganic filler or the like to 100 parts by weight of the resin. The opening of the recess 1c of the package 1 is formed in an elliptical shape. It is preferable that the major axis of the ellipse is twice as long as the minor axis. By arranging two ellipses side by side, an overall configuration proximate to circle or square can be formed. It is also made possible to obtain uniform color of mixed light. Also because of the elliptical shape, shrinkage of volume of the light-transmitting resin 4 due to hardening does not cause the wire 5 to be exposed at the top of the light-transmitting resin 4. This is because the recess at the center of the elliptical shape is smaller than the recess at the center of the circular shape.

The electrode 3 has the mount 3a where the light emitting device 2 is mounted and the back side electrode portion 3b that continues from the mount 3a. The back side electrode portion 3b is provided so as to establish connection with an outside electrode. The electrode 3 can be made by electrodeless plating, or through such processes as exposure, etching and removal of resist followed by nickel plating on copper foil and electroplating on gold. The electrode 3 may be formed from a material having high heat conductivity such as an alloy of copper, iron or the like. The iron may also be plated with silver, aluminum, gold or the like.

The light emitting device 2 may be mounted on the mount 3a, either face up by die bonding, or face down via a solder bump, gold bump or the like. Alternatively, the light emitting device 2 may be mounted on a protective element, with the protective element mounted on the electrode 3. The protective element may be, for example, a Zener diode, a capacitor or a diac.

A Zener diode has a p-type semiconductor region having a positive electrode and an n-type semiconductor region having a negative electrode, and is connected so that the negative electrode and the positive electrode of the protective element are in reverse parallel configuration with the p-side electrode and the n-side electrode of the light emitting device. When a Zener diode is used as the protective element, voltage applied across the positive and negative electrodes of the light emitting device is restricted to the Zener voltage, even when an over voltage is applied to the light emitting device, thereby protecting the light emitting device from the over voltage and preventing the failure and degradation of the device from occurring.

For the capacitor, a surface-mounted chip component may be used. A capacitor of such a construction has band-shaped electrodes at both ends, and these electrodes are connected to the positive electrode and the negative electrode of the light emitting device in parallel. When an over voltage is applied across the positive and negative electrodes, the capacitor is charged by the over voltage while reducing the terminal voltage of the capacitor instantaneously, thereby preventing the voltage applied to the light emitting device from increasing. Thus the light emitting device is protected from the over voltage. When noise including high-frequency component is applied, the capacitor acts as a bypass capacitor to remove the extraneous noise.

The light-transmitting resin 4 may be epoxy resin, silicone resin, amorphous polyamide resin, fluorocarbon resin or the like.

A fluorescent material 6 is mixed in the light-transmitting resin 4. While the light-transmitting resin 4 that is put into the recess 1c where the first light emitting device 2a is mounted must contain the fluorescent material 6 added thereto, the light-transmitting resin 4 that is put into the recess 1c where the second light emitting device 2b is mounted may or may not include the fluorescent material 6. When the fluorescent material 6 is used, the light emitting device 2 serves as an excitation light source, so that the fluorescent material is excited by the light emitted by the light emitting device 2 and emits light of wavelength different from that of the light emitting device 2. With this constitution, the light emitting apparatus 10 that emits light of various color tones can be provided. The fluorescent material 6 that is mixed in the light-transmitting resin 4, which is put into the recess 1c where the first light emitting device 2a is mounted, is preferably a nitride fluorescent material. There is no restriction on the fluorescent material 6 that is mixed in the light-transmitting resin 4, which is put into the recess 1c where the second light emitting device 2b is mounted, and various fluorescent materials may be used.

Driving of this light emitting apparatus can be easily controlled, since only two light emitting devices are used unlike 3-wavelength LED constitution.

For example, the light emitting apparatus is made by placing the first light emitting device 2a that emits blue light in one of the recesses 1c, and placing the nitride fluorescent material 6 that emits red light on the first light emitting device 2a, while placing the second light emitting device 2b that emits green light in the other recess 1c. With this constitution, the three primary colors of blue, green and red are obtained so that the light emitting apparatus that emits light of a desired color tone can be provided. The light emitting apparatus having three-color capability can also be provided by controlling the current supplied to the two light emitting devices, as blending of blue light, green light and red light is produced when current is supplied only to the first light emitting device 2a, green light is produced when current is supplied only to the second light emitting device 2b, and white light is produced when current is supplied to both the first light emitting device 2a and the second light emitting device 2b. Intermediate colors can also be produced by controlling the amount of current supplied.

For example, the light emitting apparatus is made by placing the first light emitting device 2a that emits blue light in one of the recesses 1c, and placing the nitride fluorescent material 6 that emits red light on the first light emitting device 2a, while placing the second light emitting device 2b that emits green light in the other recess 1c and placing a fluorescent material that emits red light on the second light emitting device 2b. With this constitution, the three primary colors of blue, green and red are obtained so that the light emitting apparatus that emits light of desired color tone can be provided. The light emitting apparatus having three-color capability can also be provided by controlling the current supplied to the two light emitting devices, as mixed light from blue light and red light is produced when current is supplied only to the first light emitting device 2a, mixed light from green light and red light is produced when current is supplied only to the second light emitting device 2b, and white light is produced when current is supplied to both the first light emitting device 2a and the second light emitting device 2b. Intermediate colors can also be produced by controlling the amount of current supplied.

For example, the light emitting apparatus is made by placing the first light emitting device 2a that emits ultraviolet ray in one of the recesses 1c, and placing the nitride fluorescent material 6 that emits red light on the first light emitting device 2a, while placing the second light emitting device 2b that emits green light in the other recess 1c. With this constitution, the light emitting apparatus that produces light of a predetermined color tone from green light and red light can be provided. Since ultraviolet ray does not affect the luminous efficiency, color of the light emitted by the apparatus is determined solely by the red light emitted by the nitride fluorescent material, even when the first peak emission wavelength of the first light emitting device 2a deviates, thus resulting in the light emitting apparatus that experiences extremely less color deviation.

Second Embodiment

Figure 5:
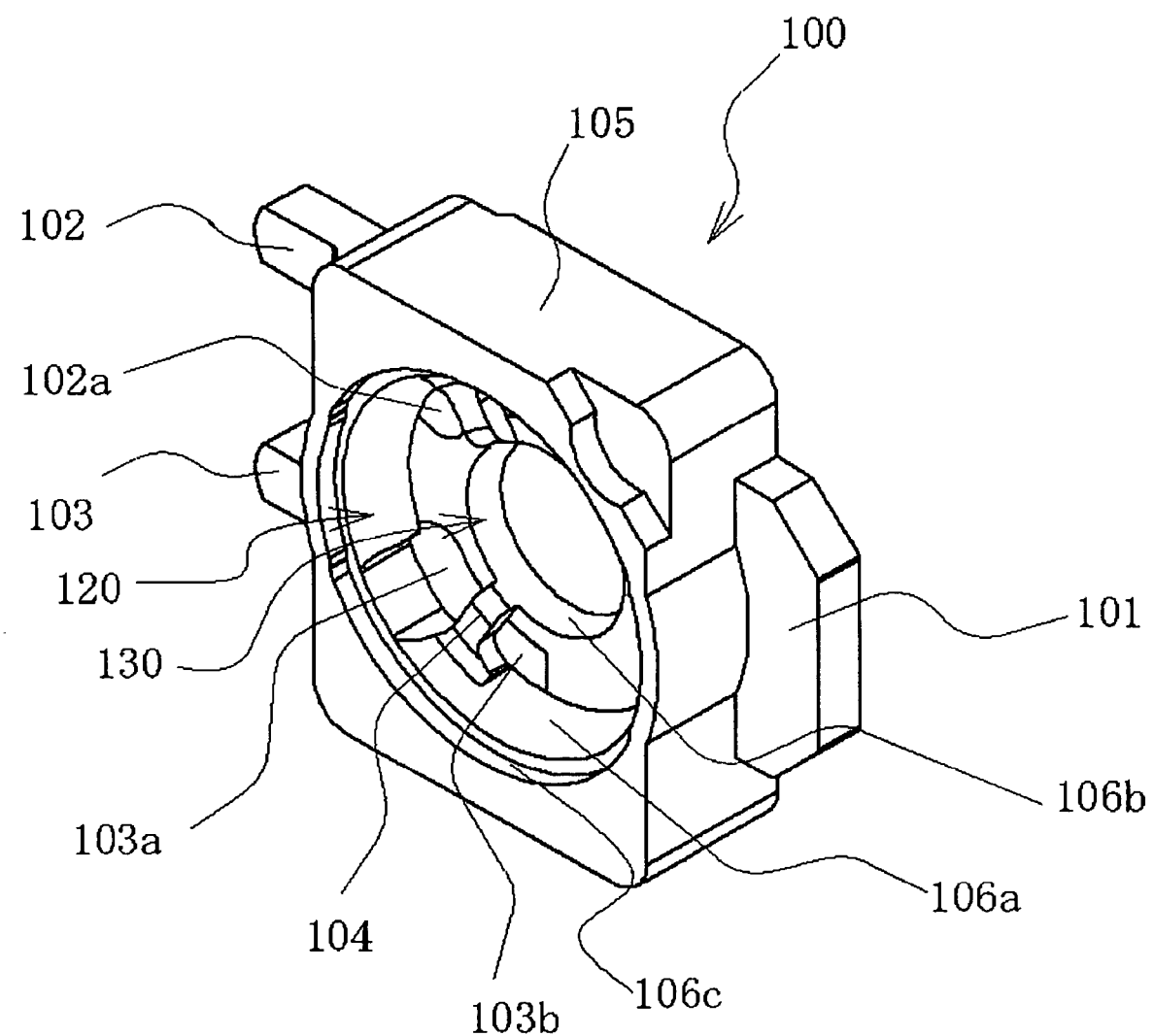
FIG. 5 is a schematic perspective view of the molded package according to the second embodiment.
Figure 6:
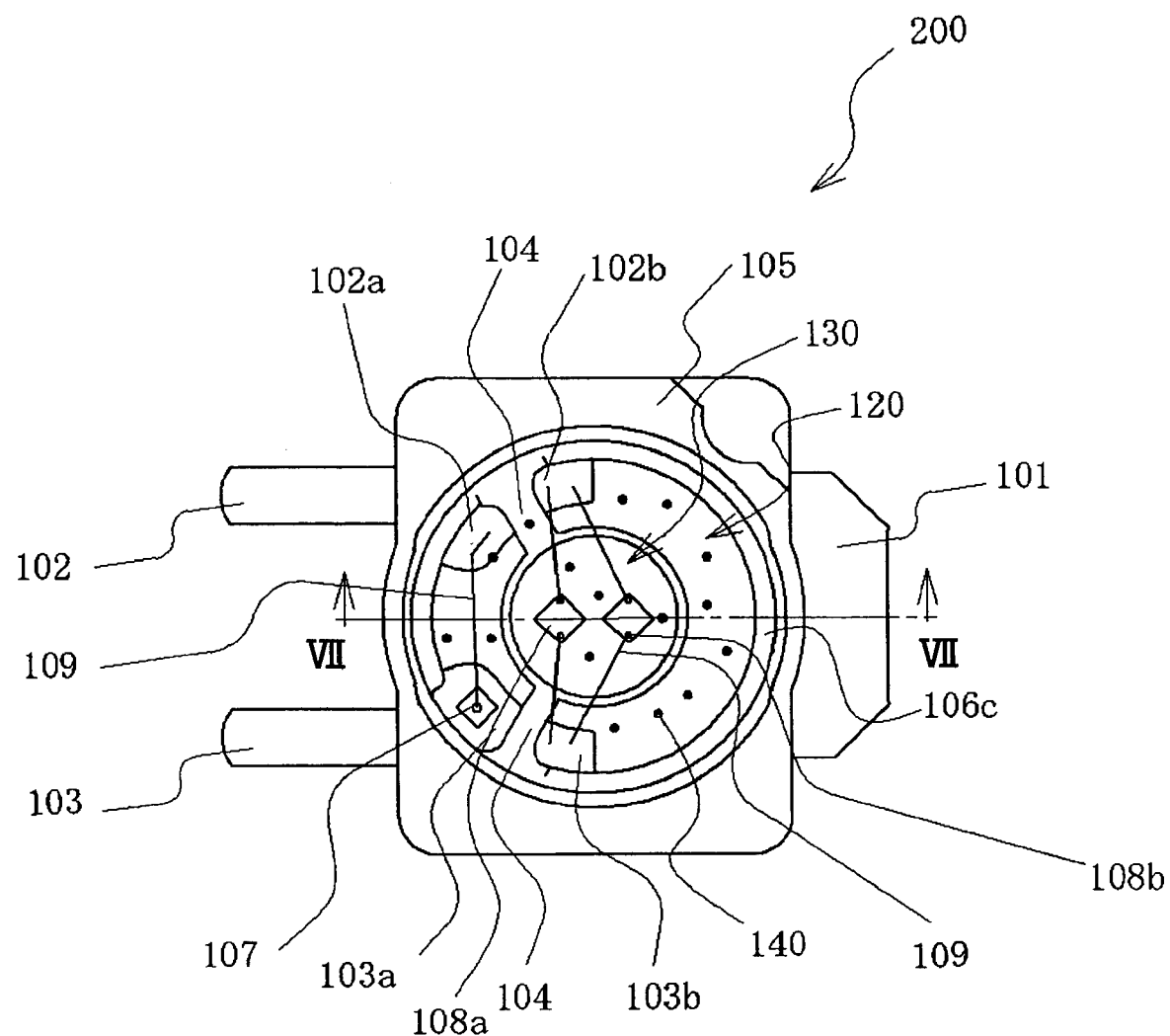
FIG. 6 is a schematic top view showing the semiconductor device according to the second embodiment.
Figure 7:
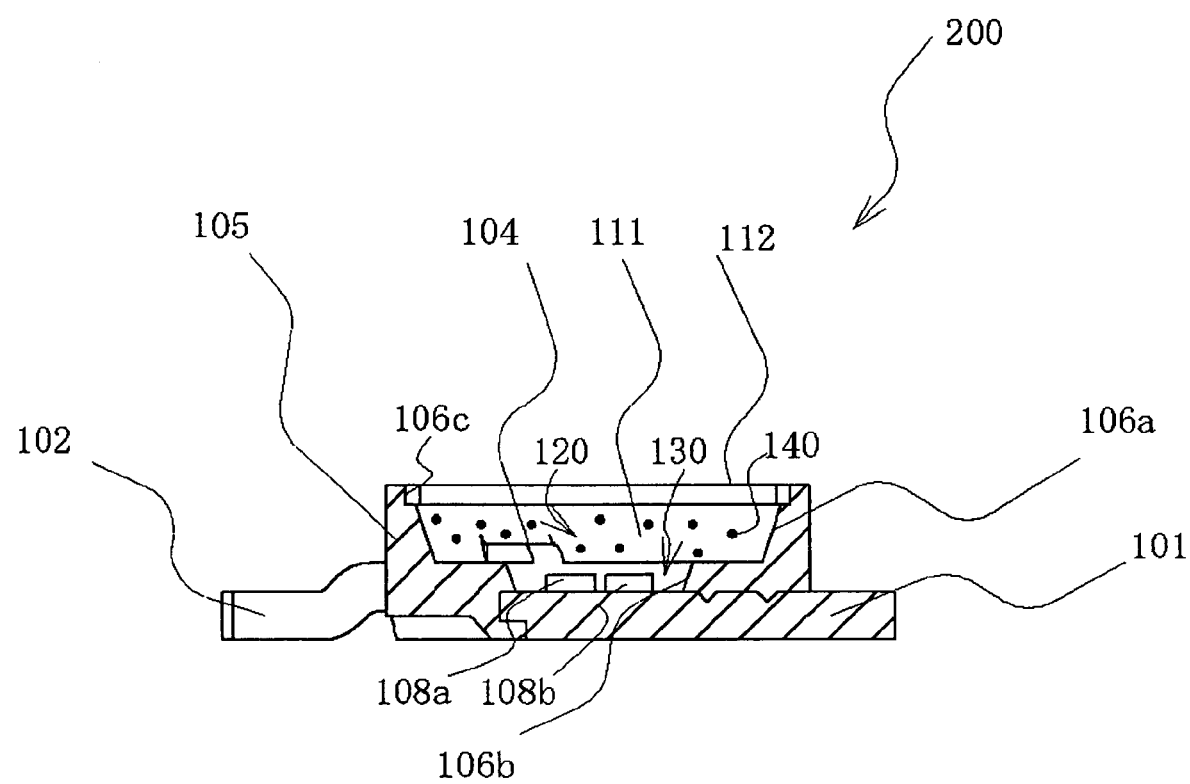
FIG. 7 is a schematic sectional view of the molded package according to the second embodiment.
Figure 8:
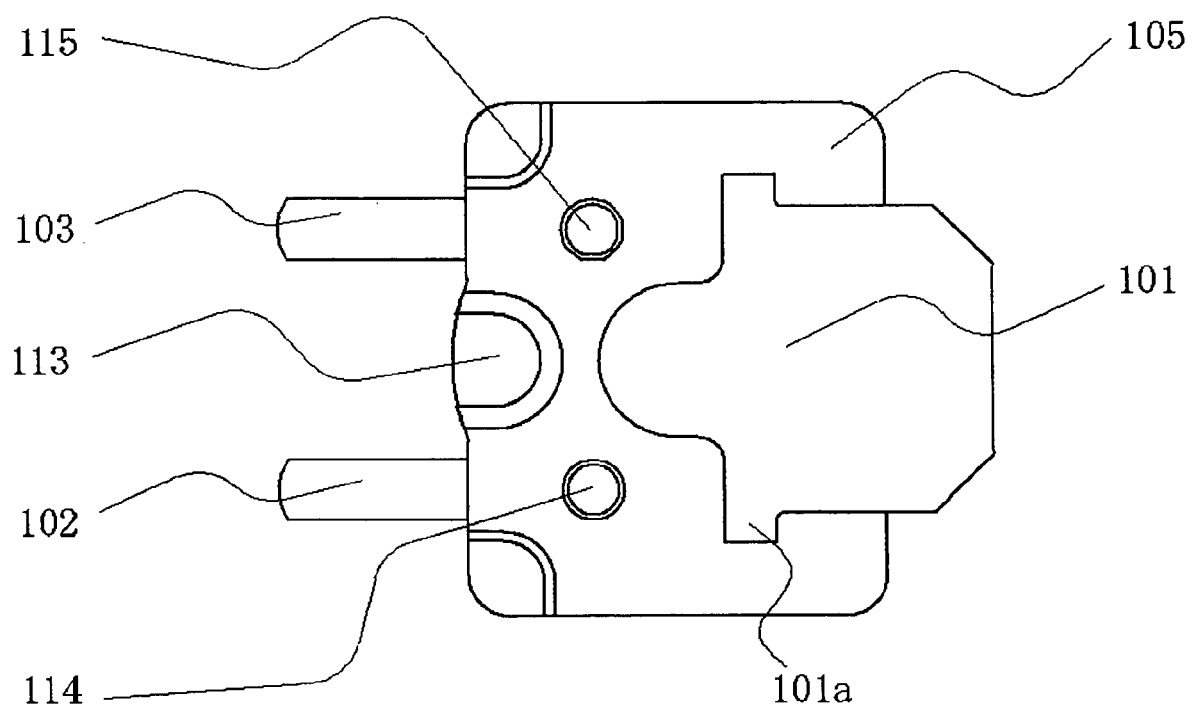
FIG. 8 is a schematic rear view of the molded package according to the second embodiment.

FIG. 5 is a schematic perspective view of a molded package according to a second embodiment. FIG. 6 is a schematic top view showing a state of the molded package according to the second embodiment where the light emitting device is mounted. FIG. 7 is a schematic sectional view along dashed line VII-VII of FIG. 6. FIG. 8 is a schematic rear view of the molded package according to the second embodiment.

The molded package 100 comprises a first base metal 101, a second base metal 102 and a third base metal 103 that are disposed to oppose each other and are isolated from each other by a molded member 105. The first base metal 101, the second base metal 102 and the third base metal 103 are formed by integral molding of the molded member 105, so that end portions thereof are inserted in the molded member 105 while the other end portions protrude from the outer wall surface of the molded member 105. The first base metal 101 protrudes from the outer wall surface that opposes the outer wall surface from which the second base metal 102 and the third base metal 103 protrude. The molded package 100 has a recess (first recess 120) formed by an inner wall surface 106a for accommodating the light emitting device 108 provided on a principal surface side thereof, and principal surfaces of the base metals are partially exposed on the bottom surface of the recess. A second recess 130 is formed by an inner wall surface 106b in the first recess 120, and principal surface of the first base metal is exposed on the bottom surface of the second recess 130. In this specification, the term "principal surface" refers to one of the surfaces of each member of the light emitting apparatus such as the molded package, the base metal or the lead electrode, where the light emitting device 108 is mounted, for example, the surface on the light emitting surface side where light is extracted from the light emitting device 108.

The light emitting device 108 has a first light emitting device 108a and a second light emitting device 108b. The first light emitting device has a first peak emission wavelength in a region ranging from ultraviolet to short wavelength of visible light. The second light emitting device 108b has second peak emission wavelength longer than the first peak emission wavelength. At least one of the first recess 120 and the second recess 130 has a fluorescent material 140 placed therein. The fluorescent material 140 converts the light from the first light emitting device 108a to light of different wavelength. Accordingly, the light from the first light emitting device 108a that has the first peak emission wavelength in the short wavelength region of visible light, the light from the fluorescent material 140 and the light from the second light emitting device 108b are mixed and emitted to the outside. Or, alternatively, while using the first light emitting device 108a that has the peak emission wavelength in the ultraviolet region, the light from the fluorescent material 140 and the light from the second light emitting device 108*b* are mixed and emitted to the outside. However, even when the first light emitting device 108*a* has the peak emission wavelength in the ultraviolet region, visible light is emitted if the device has a broad emission spectrum and therefore the light from the second light emitting device 108*b* and the light from the fluorescent material 140 are mixed and the mixed light is emitted to the outside. In this specification, the term "short wavelength region of visible light" refers to a region of wavelengths λp from 380 nm to 495 nm inclusive, and "ultraviolet region" refers to a region of wavelengths λp from 300 nm upward and less than 380 nm.

The first recess 120 preferably has a step 106*c* located near the opening. By providing the step 106*c*, it is made possible to prevent a sealing resin having high viscosity such as soft silicone resin from creeping up to the top surface of the molded package. Therefore, a sealing resin having high viscosity such as soft silicone resin can be used.

The first base metal 101 may have a recess on the principal surface side, and the light emitting device 108 can be mounted on the bottom surface of the recess. The rear surface of the first base metal 101 opposing the principal surface is exposed from the molded member 105, and is substantially flush with the rear surface of the molded package 100. This constitution makes it easier to mount the light emitting apparatus and improves heat dissipation efficiency of the light emitting apparatus since contact area with the mounting surface increases.

The second base metal 102 and the third base metal 103 make the lead electrodes for supplying power to the light emitting device 108 and the protective device 107 that are mounted in the recess provided in the principal surface of the molded package 100. Part of the rear surfaces of the second base metal 102 and the third base metal 103 that oppose the principal surface protruding from the outer wall surface of the molded package 100 is bent so as to become substantially flush with the rear surface of the molded package 100 (rear surface of the first base metal 101), thereby to make a terminal section for connecting with an electrically conductive pattern provided on an external packaging circuit board. The principal surfaces of the second base metal 102 and the third base metal 103 are partially exposed on the bottom surface of the first recess 120 of the package 100, and the exposed principal surface is divided by extending a part of the molded member 105 that forms the inner wall of the first recess 120 as a wall 104 in the direction toward the second recess 130 up to a position where the part of the wall surface of the wall 104 becomes substantially flush with the inner wall surface 106*b*. The divided principal surface has a plurality of bonding regions 102*a*, 102*b*, 103*a*, 103*b*, that is, a region where an electrically conductive wire is wire-bonded for connection with the light emitting device 108, or region where the protective device is die-bonded for protection of the light emitting device 108 from over-voltage. The light emitting apparatus, in particular, has the light emitting device 108 mounted on the bottom surface of the second recess 130 and the protective device 107 that has the back electrode, while the protective device 107 is mounted so as to oppose one of the bonding regions via an electrically conductive member. The electrically conductive wire that connects to the light emitting device 108 and the protective device 107, or the protective device 107 is separated by the wall 104 and is wire-bonded in the different regions 102*a*, 102*b*, 103*a*, 103*b*. For example, the protective device 107 is die-bonded onto in the bonding region 103*a* of the third base metal 103, and the electrically conductive wire 109 that connects the protective device 107 is wire-bonded in the bonding region 102*a* of the second base metal 102. In this case, the electrically conductive wire 109 that connects to the same polarity as the bonding region 103*a* where the protective device 107 is die-bonded, among the electrically conductive wires 109 that connect to the light emitting device 108, is wire-bonded in the bonding region 103*b* which adjoins the bonding region 103*a* where the protective device 107 is die-bonded and is separated by the wall 104. On the other hand, the electrically conductive wire 109 that connects to the same polarity as the bonding region 102*a* where the electrically conductive wire 109 that connects to the protective device 107 is wire-bonded, among the electrically conductive wires 109 that connect to the light emitting device 108, is wire-bonded in the bonding region 102*b* which adjoins the wire bonding region and is separated therefrom by the wall 104. Number of the electrically conductive wires 109 is not limited as long as these wires are wire-bonded in the same bonding region. Such a constitution provides the light emitting apparatus having high reliability, since electrical continuity can be maintained even when a wire is broken, as long as the other wires are not broken. The wall 104 covers the principal surfaces of the second base metal 102 and the third base metal 103, while leaving an area necessary for bonding of the electrically conductive wires 109 and the protective device 107 to remain. As a result, since the regions of the first member 101, the second member 102 and the third member 103 that are exposed on the bottom of the recess can be made smaller than that in the case of the prior art, the first sealing member 111 and the second sealing resin 112 are less likely to peel off the molded package. Also because the contact area of the wall 114 with the sealing member and the molded member that have relatively high bonding capability with each other can be increased, the sealing member is less likely to peel off the molded package. Stress in the sealing member is concentrated in the direction of the wall 104. Therefore, since the electrically conductive wire 109 is less likely to be affected by the stress in the sealing member, the electrically conductive wire 109 is therefore less likely to peel off the bonding region.

Members used in the second embodiment will now be described in detail, whereas the members used in the first embodiment have similar constitutions.

(Light Emitting Device)

While there are no restrictions on the light emitting device, a light emitting device having a pair of positive and negative electrodes provided on the same side is used in case the lead electrodes and the base metals are molded with a resin. It is also preferable that the light emitting device has a light emitting layer that emits light of such wavelengths that are capable of exciting the fluorescent material. While such a light emitting device may be formed from various semiconductors such as ZnSe or GaN, it is preferable to use a nitride semiconductor $(In_XAl_YGa_{1-X-Y}N$ $(0 \leq X, 0 \leq Y, X+Y \leq 1)$ that emits light of short wavelengths that are capable of efficiently exciting the fluorescent material. The nitride semiconductor may also contain boron or phosphorus added thereto as required. The semiconductor may have such a structure as homojunction structure, heterojunction structure or double heterojunction structure having MIS junction, PIN junction or pn junction. Emission wavelength can be selectively set by controlling the material used in the semiconductor layer and the extent of crystal mixing in the material. The semiconductor active layer may also be formed in a thin film having single quantum well structure or multiple quantum well structure in which quantum effect takes place. When a nitride semiconductor is used, a substrate for the semiconductor is preferably made of sapphire, spinel, SiC, Si, ZnO, GaN or the like. In order to form the nitride semiconductor of high crystallinity satisfactorily in mass production, it is preferable to use a sapphire substrate. The nitride semiconductor can be formed on the sapphire substrate by MOCVD process or the like. After forming a buffer layer from GaN, AlN, GaAlN or the like on the sapphire substrate, the nitride semiconductor having pn junction is formed thereon. A light emitting device of double heterojunction structure having a pn junction formed from a nitride semiconductor may be made by successively forming, on a buffer layer, a first contact layer of n-type gallium nitride, a first cladding layer of n-type aluminum nitride gallium, an active layer indium nitride gallium, a second cladding layer of p-type aluminum nitride gallium and a second contact layer of p-type gallium nitride. A nitride semiconductor shows n-type electrical conductivity when it is not doped with an impurity. In order to form an n-type nitride semiconductor having desired property such as improved efficiency of light emission, it is preferable to add n-type dopant such as Si, Ge, Se, Te, C or the like. In order to form a p-type nitride semiconductor, p-type dopant such as Zn, Mg, Be, Ca, Sr, Ba or the like is added. Since it is difficult to turn a nitride semiconductor to p-type simply by doping it with a p-type dopant, it is preferable to decrease the resistance of the semiconductor by heating it in a furnace, through plasma irradiation or the like, after doping with the p-type dopant. Such a process may also be employed as a metal layer is formed on the p-type layer and then the substrate is removed. When the light emitting device formed in such a constitution is mounted so that the metal layer is located on the component mounting side, the light emitting apparatus having high heat dissipation property is obtained. After forming the electrodes on the p-type layer and the n-type layer that have been exposed, the light emitting devices made of the nitride semiconductor are obtained by cutting semiconductor wafer into chips.

The first light emitting device 108a that has a first peak emission wavelength in the short wavelength region of the visible light preferably has a peak emission wavelength in a range from 380 nm to 495 nm, particularly from 380 nm to 420 nm, or from 440 nm to 485 nm. For example, the first light emitting device 108a having the first peak emission wavelength at 400 nm, from 440 nm to 445 nm, or from 455 nm to 465 nm is used. The first light emitting device 108a that has a first peak emission wavelength in the ultraviolet region preferably has the peak emission wavelength in a range from 300 nm to 380 nm, particularly from 350 nm to 380 nm.

While the second light emitting device 108b may be such that has the second peak emission wavelength which is longer than the first peak emission wavelength, it is preferable that the second peak emission wavelength is shorter than the peak emission wavelength of the fluorescent material 140. This constitution makes it possible to produce light of various colors. When the first light emitting device 108a that has the first peak emission wavelength in the short wavelength region of the visible light is used, in particular, it is preferable that the second light emitting device 108b has the second peak emission wavelength in a range from 495 nm to 573 nm. In case the first light emitting device 108a that has first peak emission wavelength in the ultraviolet region is used, on the other hand, it is preferable that the second light emitting device 108b has the second peak emission wavelength in a range from 400 nm to 573 nm.

(Protective Device)

The protective device is accommodated along with the semiconductor device such as the light emitting device in the first recess 120 of the molded package, and protects the other semiconductor device from destruction due to over-voltage. The protective device may or may not have semiconductor structure.

The protective device that can be used in this embodiment may be a Zener diode that is switched to continuation when a voltage higher than a threshold is applied, or a capacitor that absorbs voltage surge.

A Zener diode has a p-type semiconductor region having a positive electrode and an n-type semiconductor region having a negative electrode, and is connected so that the negative electrode and the positive electrode of the protective element are in reverse parallel configuration with the p-side electrode and the n-side electrode of the light emitting device. When a Zener diode is used as the protective element, voltage applied across the positive and negative electrodes of the light emitting device is restricted to the Zener voltage, even when an excessive voltage is applied to the light emitting device, thereby protecting the light emitting device from the excessive voltage and preventing the failure and degradation of the device from occurring.

For the capacitor, a surface-mounted chip component may be used. A capacitor of such a construction has band-shaped electrodes on both ends, and these electrodes are connected to the positive electrode and the negative electrode of the light emitting device in parallel. When an over-voltage is applied across the positive and negative electrodes, the capacitor is charged by the over-voltage while reducing the terminal voltage of the capacitor instantaneously, thereby preventing the voltage applied to the light emitting device from increasing. Thus the light emitting device is protected from the over-voltage. When noise including high-frequency component is applied, the capacitor acts as a bypass capacitor to remove the extraneous noise.

(Sealing Member)

The sealing member of this embodiment covers the light emitting device that is accommodated in the molded package. For example, the sealing member made of soft silicone resin or epoxy resin may be used individually as the sealing member. The sealing member may also be provided in such a constitution as the light emitting device 108 is covered by a first sealing member 111 that is in turn covered by a second sealing member 112. Reliability of the light emitting apparatus can be improved by using the first sealing member 111 made of a soft material and the second sealing member 112 made of a hard material. In addition to the fluorescent material 140, the sealing member may contain a dispersing agent, filler or the like.

The light emitting apparatus is completed by securing the sub-mount on the first base material, that is exposed on the bottom surface of the second recess 130, using an Ag paste as an adhesive and connecting the lead electrodes exposed in the recess and the positive and negative electrodes of the sub-mount by means of the electrically conductive wire 109.

(Soft Member)

A soft member may be provided so as to extend from within the first recess 120 of the molded package to the lower end of the hard member located above, so that the semiconductor device mounted on the molded package as described above is covered. The soft member is capable of, in addition to protecting the semiconductor device from moisture, efficiently extracting light from the light emitting device to the outside due to the translucency thereof. Also because of high stability against heat, the soft member can reduce the thermal stress generated when the light emitting apparatus functions. When the light emitting device that emits in the near ultraviolet region or in the violet region is used, it is preferable to use a soft member that has high durability against the ultraviolet ray. The soft member may be made of rubber-like elastic resin, a resin having gel structure such as gel-like silicone resin or the like. These resins have low density of linkage or do not have linkage structure at all, and show favorable pliability. A coloring dye or a coloring pigment may be added to the soft member so as to provide a filtering effect to the light emitted by the light emitting device chip.

(Hard Member)

In the light emitting apparatus, the soft member that covers the light emitting device 108 is sealed by the hard member. There is no restriction on the hard member as long as it has a certain level of mechanical strength and also has light-transmitting property.

In this embodiment, the hard member that serves as a window for extracting light is located above the light emitting device 108 that is mounted in the first recess 120 of the molded package, and emits light, so as to make contribution to light emission by the light emitting apparatus, in a portion thereof located inside of the intersect of an extension of the inner wall surface of the first recess 120 and the top surface of the hard member. Light emitted from the end of the light emitting device is reflected and scattered in the soft member and passes through the hard member so as to be extracted in the direction normal to the front surface. The reflected and scattered light is considered to reside within the area inside of the extension of the inner wall surface of the first recess 120. Thus the light emitting apparatus capable of emitting light with a desired level of luminance can be obtained by controlling the shape of the portion located inside of the intersect. It is preferable that the hard member has a value of thermal expansion coefficient similar to those of the molding resin that forms the package and the soft member provided below. For example, in case the soft member is made of a gel-like silicone resin, the hard member is preferably made of a hard silicone resin. With this constitution, such a trouble can be prevented from occurring, as dust sticks to the sticky gel-like silicone resin and causes adverse effect to the optical characteristic of the semiconductor device.

It is preferable that the hard member has a continuous rear surface. This configuration enables highly reliable mounting without air bubble entering the interface between the hard member and the soft member. The principal surface side, on the other hand, may include a curved surface protruding at the center thereof, within a portion located inside of an extension of the side face of the recess. This configuration makes it possible to efficiently converge the light, that has been diffused on the rear side, into the direction normal to the front surface and increase the luminous intensity in that direction. The hard member makes contact with the outline of the principal surface from within, and is structurally integrated with the soft member. A coloring dye or a coloring pigment may be added to the hard member so as to provide a filtering effect to the light emitted by the light emitting device chip.

(Fluorescent Material)

(Nitride Fluorescent Material)

The fluorescent material 140 that is excited by the first light emitting device is made of nitride fluorescent material. The nitride fluorescent material contains at least one kind of group II element selected from among a group consisting of Be, Mg, Ca, Sr, Ba and Zn, at least one kind of group IV element selected from among a group consisting of C, Si, Ge, Sn, Ti, Zr and Hf, and element N, and is activated with at least one kind of rare earth element selected from among a group consisting of Y, La, Ce, Pr, Nd, Sm, Eu, Gd, Tb, Dy, Ho, Er and Lu. The nitride fluorescent material preferably contains B in a concentration from 1 ppm to 10000 ppm. The nitride fluorescent material may also contain O in the composition thereof. Among the compositions of the nitride fluorescent material described above, the nitride fluorescent material that contains Ca and/or Sr, and also contains Si and N, which is also activated with Eu and contains B in a concentration from 1 ppm to 10000 ppm is preferably used. Part of Eu may be replaced with at least one kind of rare earth element selected from among a group consisting of Y, La, Ce, Pr, Nd, Sm, Gd, Tb, Dy, Ho, Er and Lu. Part of La and/or Sr may be replaced with at least one kind of group II element selected from among a group consisting of Be, Mg, Ba and Zn. Part of Si may be replaced with at least one kind of group IV element selected from among a group consisting of C, Ge, Sn, Ti, Zr and Hf.

The nitride fluorescent material is represented by a general formula $L_X M_Y N_{((2/3)X+(4/3)Y)}$: R or $L_X M_Y O_Z N_{((2/3)X+(4/3)Y-(2/3)Z)}$:R (L is at least one kind of group II element selected from among a group consisting of Be, Mg, Ca, Sr, Ba and Zn; M is at least one kind of group IV element selected from among a group consisting of C, Si, Ge, Sn, Ti, Zr and Hf; R is at least one kind of rare earth element selected from among a group consisting of Y, La, Ce, Pr, Nd, Sm, Eu, Gd, Tb, Dy, Ho, Er and Lu; while X, Y and Z satisfy relationships $0.5 \leq X \leq 3$, $1.5 \leq Y \leq 8$, $0 < Z \leq 3$). Or, alternatively, the nitride fluorescent material is represented by a general formula $L_X M_Y T_U O_Z N_{((2/3)X+(4/3)Y+U-(2/3)Z)}$:R (L is at least one kind of group II element selected from among a group consisting of Be, Mg, Ca, Sr, Ba and Zn; M is at least one kind of group IV element selected from among a group consisting of C, Si, Ge, Sn, Ti, Zr and Hf; T is at least one kind selected from B, Al, Ga, In and Sc; R is at least one kind of rare earth element selected from among a group consisting of Y, La, Ce, Pr, Nd, Sm, Eu, Gd, Tb, Dy, Ho, Er and Lu; while X, Y and Z satisfy relationships $0.5 \leq X \leq 3$, $1.5 \leq Y \leq 8$, $0 < U < 0.5$ and $0 < Z \leq 3$). While the nitride fluorescent material preferably contains T and R in molar ratio of T/R in a range from 0.001 to 1.0, a value of T/R ratio from 0.01 to 5.0 may also be employed. Specific composition of preferable nitride fluorescent material is ($Sr_T Ca_{1-T})_2Si_5N_8$:Eu, $Ca_2Si_5N_8$:Eu, $Sr_TCa_{1-T}Si_7N_{10}$:Eu, $SrSi_7N_{10}$:Eu, $CaSi_7N_{10}$:Eu, $Sr_2Si_5N_8$:Eu, $Ba_2Si_5N_8$:Eu, $Mg_2Si_5N_8$:Eu, $Zn_2Si_5N_8$:Eu, $SrSi_7N_{10}$:Eu, $BaSi_7N_{10}$:Eu, $MgSi_7N_{10}$:Eu, $ZnSi_7N_{10}$:Eu, $Sr_2Ge_5N_8$:Eu, $Ba_2Ge_5N_8$:Eu, $Mg_2Ge_5N_8$:Eu, $Zn_2Ge_5N_8$:Eu, $SrGe_7N_{10}$:Eu, $BaGe_7N_{10}$:Eu, $MgGe_7N_{10}$:Eu, $ZnGe_7N_{10}$:Eu, $Sr_{1.8}Ca_{0.2}Si_5N_8$:Eu, $Ba_{1.8}Ca_{0.2}Si_5N_8$:Eu, $Mg_{1.8}Ca_{0.2}Si_5N_8$:Eu, $Zn_{1.8}Ca_{0.2}Si_5N_8$:Eu, $Sr_{0.8}Ca_{0.2}Si_7N_{10}$:Eu, $Ba_{0.8}Ca_{0.2}Si_7N_{10}$:Eu, $Mg_{0.8}Ca_{0.2}Si_7N_{10}$:Eu, $Zn_{0.8}Ca_{0.2}Si_7N_{10}$:Eu, $Sr_{0.8}Ca_{0.2}Ge_7N_{10}$:Eu, $Ba_{0.8}Ca_{0.2}Ge_7N_{10}$:Eu, $Mg_{0.8}Ca_{0.2}Ge_7N_{10}$:Eu, $Zn_{0.8}Ca_{0.2}Ge_7N_{10}$:Eu, $Sr_{0.8}Ca_{0.2}Si_6GeN_{10}$:Eu, $Ba_{0.8}Ca_{0.2}Si_6GeN_{10}$:Eu, $Mg_{0.8}Ca_{0.2}Si_6GeN_{10}$:Eu, $Zn_{0.8}Ca_{0.2}Si_6GeN_{10}$:Eu, $Sr_2Si_5N_8$:Pr, $Ba_2Si_5N_8$:Pr or $Sr_2Si_5N_8$:Tb, $BaGe_7N_{10}$:Ce($0 < T < 1$).

The nitride fluorescent material may be one represented by general formula $L_X M_Y N_{((2/3)X+(4/3)Y)}$: R or $L_X M_Y O_Z N_{((2/3)X+(4/3)Y-(2/3)Z)}$:R that may contain B in a concentration from 1 ppm to 10000 ppm. B may be contained either by adding a boron compound to the material in wet or dry mixing, or by preparing the material $Ca_3N_2$ or $Si_3N_4$ by adding boron in advance. Since part of boron scatters during firing in the manufacturing process, content of boron after firing is less than the quantity originally added.

L is at least one group II element selected from among a group consisting of Be, Mg, Ca, Sr, Ba and Zn. While Mg, Ca or Sr may be used individually, combination such as Ca and Sr, Ca and Mg, Ca and Ba, or Ca, Sr and Ba may also be used. Particularly by containing at least one of Ca and Sr in the composition of the nitride fluorescent material, a fluorescent material having high luminance of light emission and high quantum efficiency can be provided. The nitride fluorescent material may also contain at least one of Ca and Sr, with part of Ca and Sr replaced with Be, Mg, Ba or Zn. When a mixture of two more kinds is used, the mix proportions may be varied as required. Peak emission wavelength shifts to longer wavelengths more when Sr and Ca are mixed than in the case of using only Sr or Ca. When molar ratio of Sr and Ca is 7:3 or 3:7, the peak emission wavelength shifts to longer wavelengths more significantly than in the case of using only Ca or Sr. Largest shift in peak emission wavelength is obtained when molar ratio of Sr and Ca is about 5:5.

M is at least one group IV element selected from among a group consisting of C, Si, Ge, Sn, Ti, Zr and Hf. While C, Si or Ge may be used individually, combination such as C and Si, Ge and Si, Ti and Si, Zr and Si or Ge, Ti and Si may also be employed. Particularly, the nitride fluorescent material of low cost and high crystallinity can be made by containing Si in the composition thereof. Part of Si may be replaced with C, Ge, Sn, Ti, Zr or Hf. When a mixture containing Si is used, mix proportion may be varied as required. For example, the mixture may contain 95% by weight of Si and 5% by weight of Ge.

R is at least one kind of rare earth element selected from among a group consisting of Y, La, Ce, Pr, Nd, Sm, Eu, Gd, Tb, Dy, Ho, Er and Lu. While Eu, Pr or Ce may be used individually, combination such as Ce and Eu, Pr and Eu or La and Eu. By adding Eu as an activating agent, the nitride fluorescent material of better light emitting property having peak emission wavelength in a region from yellow to red can be made. Part of Eu may be replaced with Y, La, Ce, Pr, Nd, Sm, Gd, Tb, Dy, Ho, Er or Lu. When part of Eu is replaced with other element, the replacing element acts as a co-activating agent. Co-activation enables it to vary the color tone and control the light emitting property. When a mixture containing Eu is used, mix proportion may be varied as required. In the Example described below, the rare earth element europium is used as the emission center. Europium has energy levels principally for valency of 2 and 3. $Eu^{2+}$ is used as the activation agent for silicon nitride compound of alkali earth metal element used as the major component of the fluorescent material of the present invention. $Eu^{2+}$ is easily oxidized, and is commercially available in the form of $Eu_2O_3$ that has valency of 3. In the commercially available $Eu_2O_3$, however, O makes major contribution and it is difficult to obtain a satisfactory fluorescent material. Therefore it is preferable to use a source of Eu where O is removed from $Eu_2O_3$, such as individual element of Eu or europium nitride. A fluorescent material that emits at longer wavelength can be made by controlling the content of Eu.

The addition of boron has the effects of accelerating the diffusion of $Eu^{2+}$ and improving the light emitting characteristics such as luminance of emission, energy efficiency and quantum efficiency. It also has the effect of increasing the particle size which again improves the light emitting characteristics.

The nitride fluorescent material may also contain Al, Ga, In or Sc, or a combination thereof. These elements have the effects of controlling the after glow and increasing the particle size.

The composition of the nitride fluorescent material contains oxygen. Oxygen is thought to be introduced from oxides used as the stock material, or during the firing process. The oxygen content is considered to accelerate the diffusion of Eu, growth of particles and improvement of crystallinity. This means that, while similar effects can be achieved by turning one of the compounds contained in the stock material into a metal, nitride or oxide, greater effects may be achieved by using an oxide as the stock material. Crystal structure of the nitride fluorescent material may be non-single crystal or hexagonal, as well as monoclinic or orthorhombic.

(Method for Manufacturing the Nitride Fluorescent Material)

A method for manufacturing the nitride fluorescent material represented by $Ca_2Si_5N_8$:Eu will now be described below, but it is understood that the present invention is not limited to this method.

A stock material of Ca is crushed (P1). It is preferable to use Ca in the form of element, although an imide compound, an amide compound or the like may also be used.

A stock material of Ca is nitrized in nitrogen atmosphere (P2). This reaction is represented by [Chemical Formula 1].

$$3Ca + N_2 \rightarrow Ca_3N_2 \quad \text{[Chemical Formula 1]}$$

Ca is nitrized in nitrogen atmosphere at a temperature from 600 to 900° C. for five hours to obtain a nitride of Ca.

The nitride of Ca is crushed (P3).
A stock material of Si is crushed (P4).
A stock material of Si is nitrized in nitrogen atmosphere (P5). This reaction is represented by [Chemical Formula 2].

$$3Si + 2N_2 \rightarrow Si_3N_4 \quad \text{[Chemical Formula 2]}$$

Silicon Si is also nitrized in nitrogen atmosphere at a temperature from 800 to 1200° C. for about five hours to obtain a silicon nitride.

The nitride of Si is crushed similarly (P6).
A compound of Eu, $Eu_2O_3$ is mixed (P7).
A compound of Eu, $Eu_2O_3$ is fired (P8).
Eu is crushed (P9).
After being crushed, Eu is mixed with nitrides of Ca and Si (P10).

Nitrides of Ca and Si and Eu are fired (P11). Firing temperature may be in a range from 1200 to 2000° C., but preferably in a range from 1400 to 1800° C. While it is preferable to carry out the firing process in a single step at a temperature from 1200 to 1500° C. for several hours after gradually raising the temperature, dual-step firing (multiple-step firing) process may also be employed wherein a first firing step is carried out at a temperature from 800 to 1000° C., then the temperature is raised gradually and a second firing step is carried out at a temperature from 1200 to 1500° C. This firing process produces the nitride fluorescent material having composition of $Ca_2Si_5N_8$:Eu. The reaction of producing the nitride fluorescent material during the firing process is represented by [Chemical Formula 3].

$$(1.985/3)Ca_3N_2 + (5/3)Si_3N_4 + (0.015/2)Eu_2O \rightarrow Ca_{1.985}Eu_{0.015}Si_5N_{87.990}O_{0.0225} \quad \text{[Chemical Formula 3]}$$

The nitride fluorescent material is thus obtained.

(Other Fluorescent Material)

The fluorescent material 140 of the light emitting apparatus may include one or more kind selected from among a fluorescent material that emits blue light as a complementary color, a fluorescent material that emits green light and a fluorescent material that emits yellow light may be added to the nitride fluorescent material, which makes it possible to carry out fine adjustment of the color tone. For the fluorescent material, it is preferable to use at least one selected from alkali earth element halogen apatite fluorescent material, alkali earth metal boronate halogen fluorescent material, alkali earth metal aluminate fluorescent material, silicate of alkali earth element, sulfide of alkali earth element, thiogallate of alkali earth element, alkali earth silicon nitride or germanate that is activated principally by lanthanoid element such as Eu or a transition metal element such as Mn, or aluminate of rare earth element or silicate of alkali earth element that is activated principally by a lanthanoid element such as Ce, and organic complex that is activated principally by lanthanoid element such as Eu. Specifically, the following fluorescent materials may be used, but the invention is not restricted to these materials.

Alkali earth element halogen apatite fluorescent material that is activated principally by lanthanoid element such as Eu or a transition metal element such as Mn includes those represented by $M_5(PO_4)_3X:R$ (M is at least one kind selected from Sr, Ca, Ba, Mg and Zn; X is at least one kind selected from F, Cl, Br and I; and R is at least one kind selected from Eu and Mn.

Alkali earth metal boronate halogen fluorescent material includes those represented by $M_2B_5O_9X:R$ (M is at least one kind selected from Sr, Ca, Ba, Mg and Zn; X is at least one kind selected from F, Cl, Br and I; and R is at least one kind selected from Eu and Mn.

Fluorescent material based on sulfide of alkali earth element includes $La_2O_2S:Eu$, $Y_2O_2S:Eu$ and $Gd_2O_2S:Eu$.

The rare earth element aluminate fluorescent material activated principally by a lanthanoid element such as Ce includes YAG fluorescent material having compositions $Y_3Al_5O_{12}:Ce$, $(Y_{0.8}Gd_{0.2})_3Al_5O_{12}:Ce$, $Y_3(Al_{0.8}Ga_{0.2})_5O_{12}:Ce$ and $(Y,Gd)_3(Al,Ga)_5O_{12}$.

For the silicate of alkali earth metal, orthosilicate of alkali earth metal represented by the following chemical formula is preferably used.

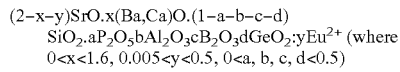
$(2-x-y)SrO.x(Ba,Ca)O.(1-a-b-c-d)$
$SiO_2.aP_2O_5bAl_2O_3cB_2O_3dGeO_2:yEu^{2+}$ (where $0<x<1.6$, $0.005<y<0.5$, $0<a, b, c, d<0.5$)

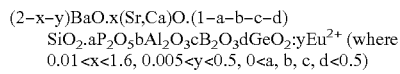
$(2-x-y)BaO.x(Sr,Ca)O.(1-a-b-c-d)$
$SiO_2.aP_2O_5bAl_2O_3cB_2O_3dGeO_2:yEu^{2+}$ (where $0.01<x<1.6$, $0.005<y<0.5$, $0<a, b, c, d<0.5$)

In the formula described above, at least one of a, b, c and d is greater than 0.01.

The fluorescent material made of salt of alkali earth metal may be, in addition to the silicate of alkali earth metal described above, alkali earth metal aluminate fluorescent material activated with europium and/or manganese, $Y(V,P,Si)O_4:Eu$ or alkali earth metal-magnesium-disilicate represented by the following formula.

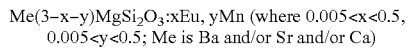
$Me(3-x-y)MgSi_2O_3:xEu$, $yMn$ (where $0.005<x<0.5$, $0.005<y<0.5$; Me is Ba and/or Sr and/or Ca)

The alkali earth metal aluminate fluorescent material includes $SrAl_2O_4:R$, $Sr_4Al_{14}O_{25}:R$, $CaAl_2O_4:R$, $BaMg_2Al_{16}O_{27}:R$, $BaMg_2Al_{16}O_{12}:R$ and $BaMgAl_{10}O_{17}:R$. (where R is either Eu, Mn or Eu and Mn)

The other fluorescent material includes $ZnS:Eu$, $Zn_2GeO_4:Mn$, $MGa_2S_4:Eu$ (where M is at least one kind selected from Sr, Ca, Ba, Mg and Zn; X is at least one kind selected from F, Cl, Br and I). $M_2Si_5N_8:Eu$, $MSi_7N_{10}:Eu$, $M_{1.8}Si_5O_{0.2}N_8:Eu$, $M_{0.9}Si_7O_{0.1}N_{10}:Eu$ (where M is at least one kind selected from Sr, Ca, Ba, Mg and Zn) may also be used.

The fluorescent material may include at least one kind selected from among Tb, Cu, Ag, Au, Cr, Nd, Dy, Co, Ni and Ti, instead of, or in addition to Eu as required.

Besides the fluorescent materials described above, a fluorescent material having equivalent performance and effects may be used.

The fluorescent material 108 may be located at various positions relative to the light emitting device 101 in the light emitting apparatus II. For example, the fluorescent material 108 may be contained in the molding material that covers the light emitting device 101. The light emitting device 101 and the fluorescent material 108 may be spaced from each other, or the fluorescent material 108 may be placed on the light emitting device 101.

EXAMPLES

Examples 1 and 2

Figure 9:
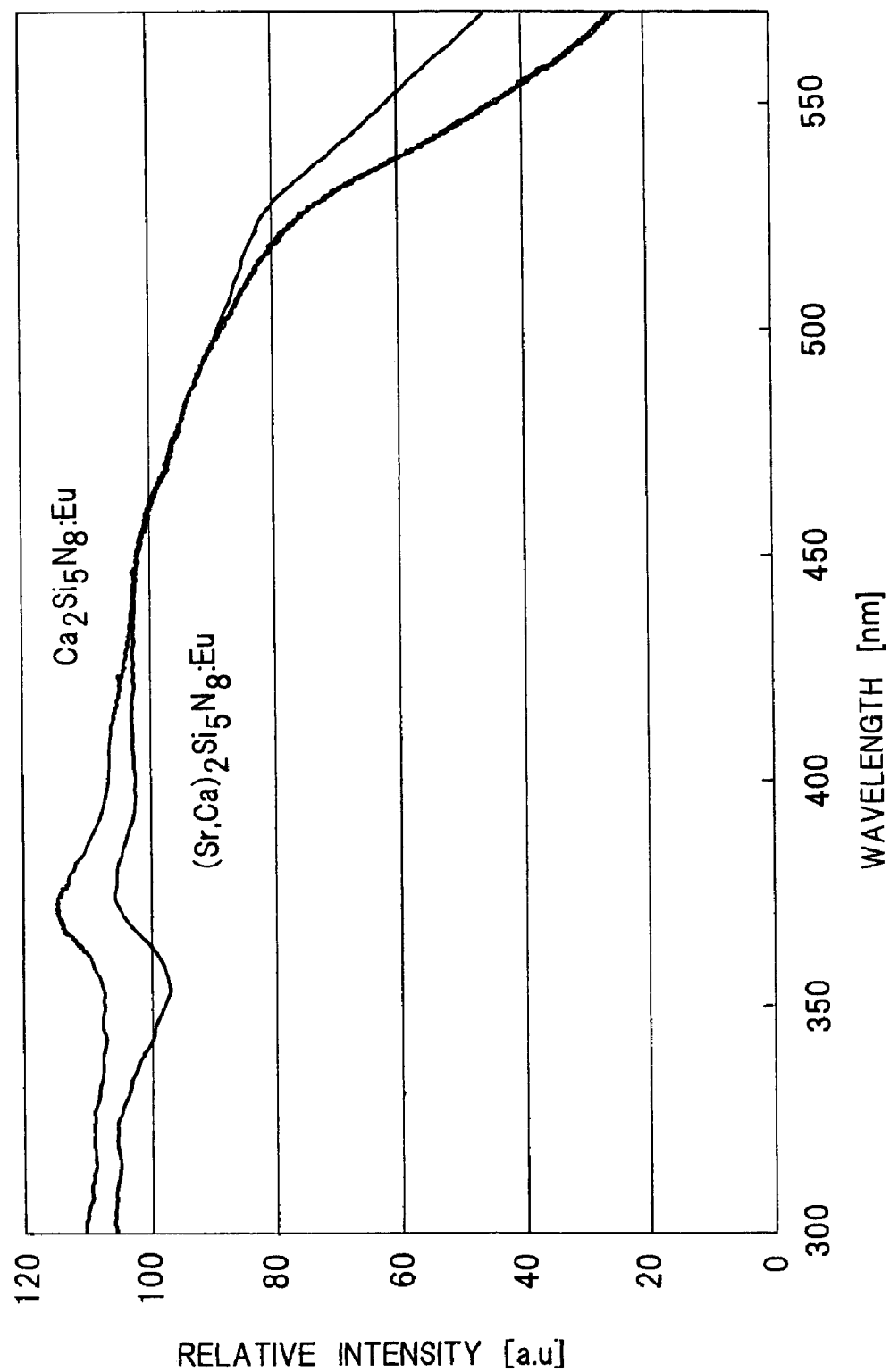
FIG. 9 shows an excitation spectrum of the nitride fluorescent material.
Figure 10:
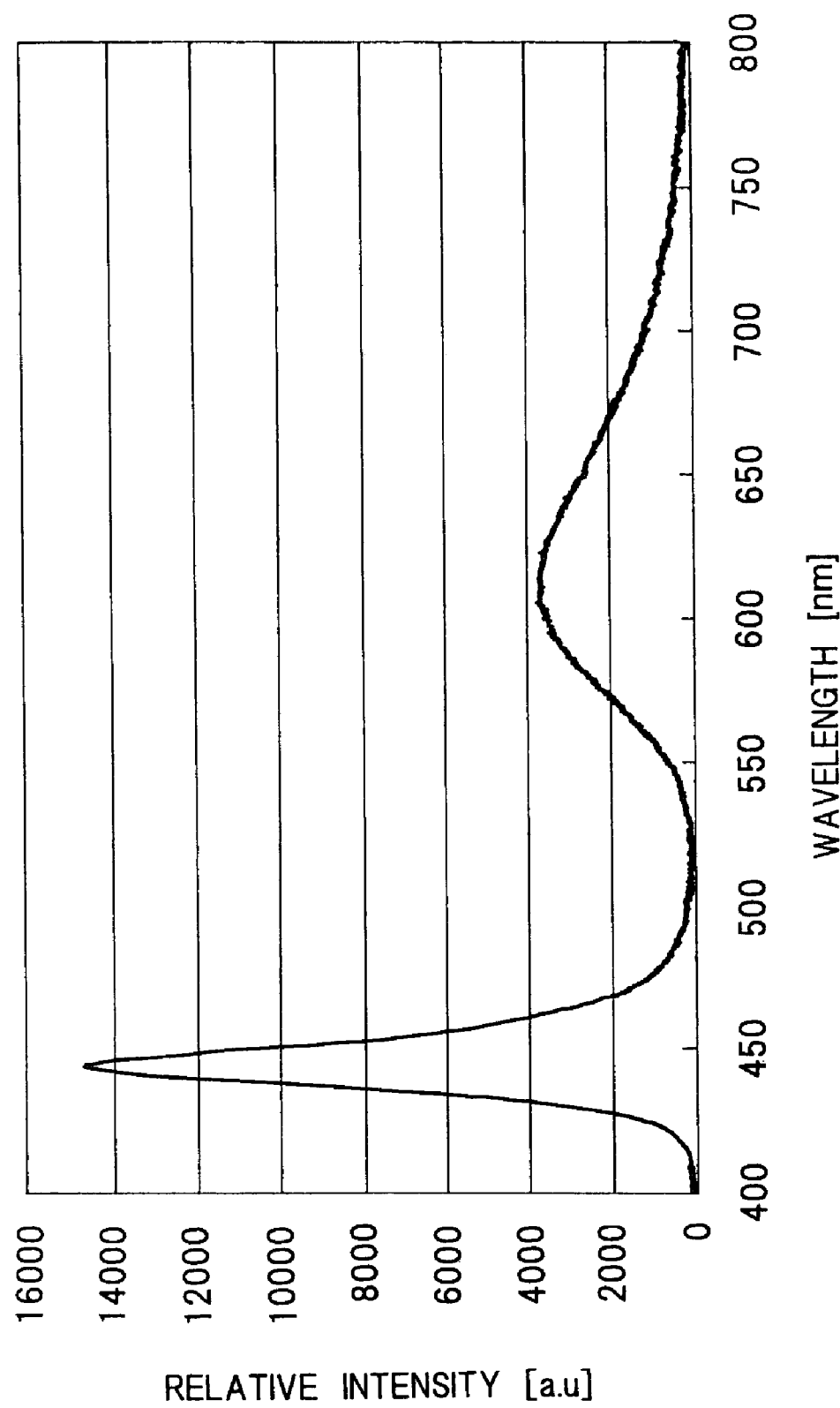
FIG. 10 shows an emission spectrum of the nitride fluorescent material excited by a blue LED of the light emitting apparatus according to Example 1.
Figure 11:
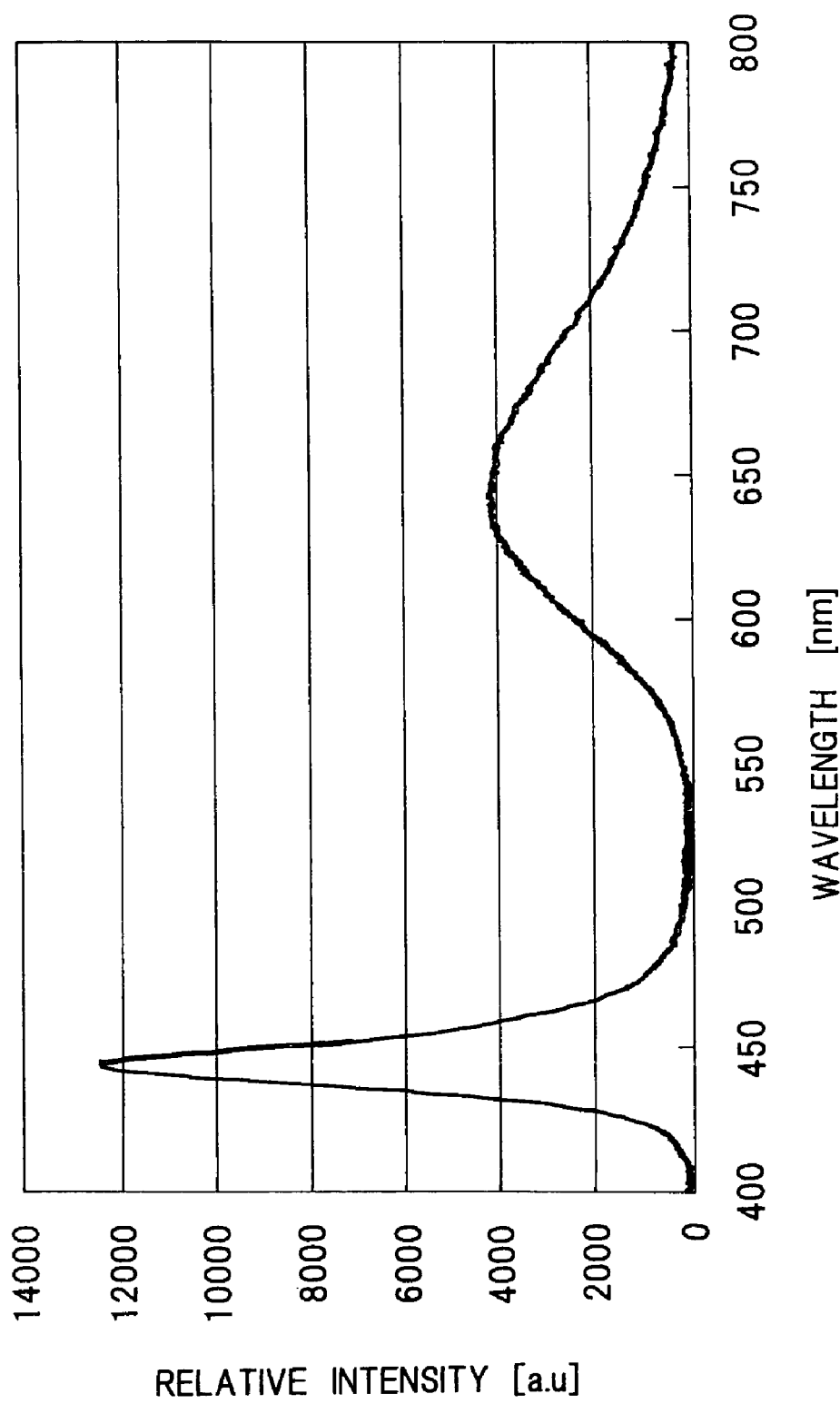
FIG. 11 shows an emission spectrum of the nitride fluorescent material excited by a blue LED of the light emitting apparatus according to Example 2.
Figure 12:
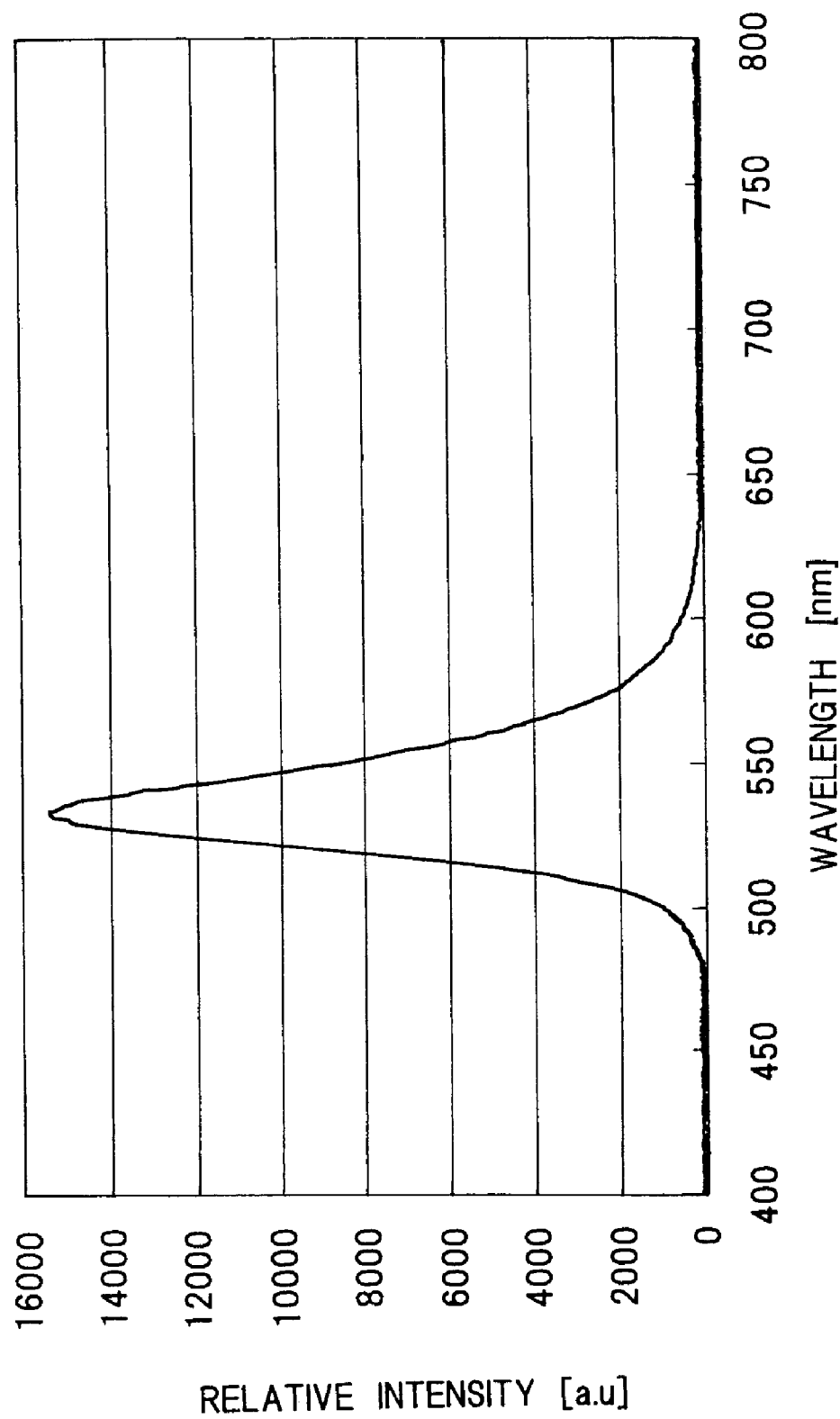
FIG. 12 shows an emission spectrum of a green LED.
Figure 13:
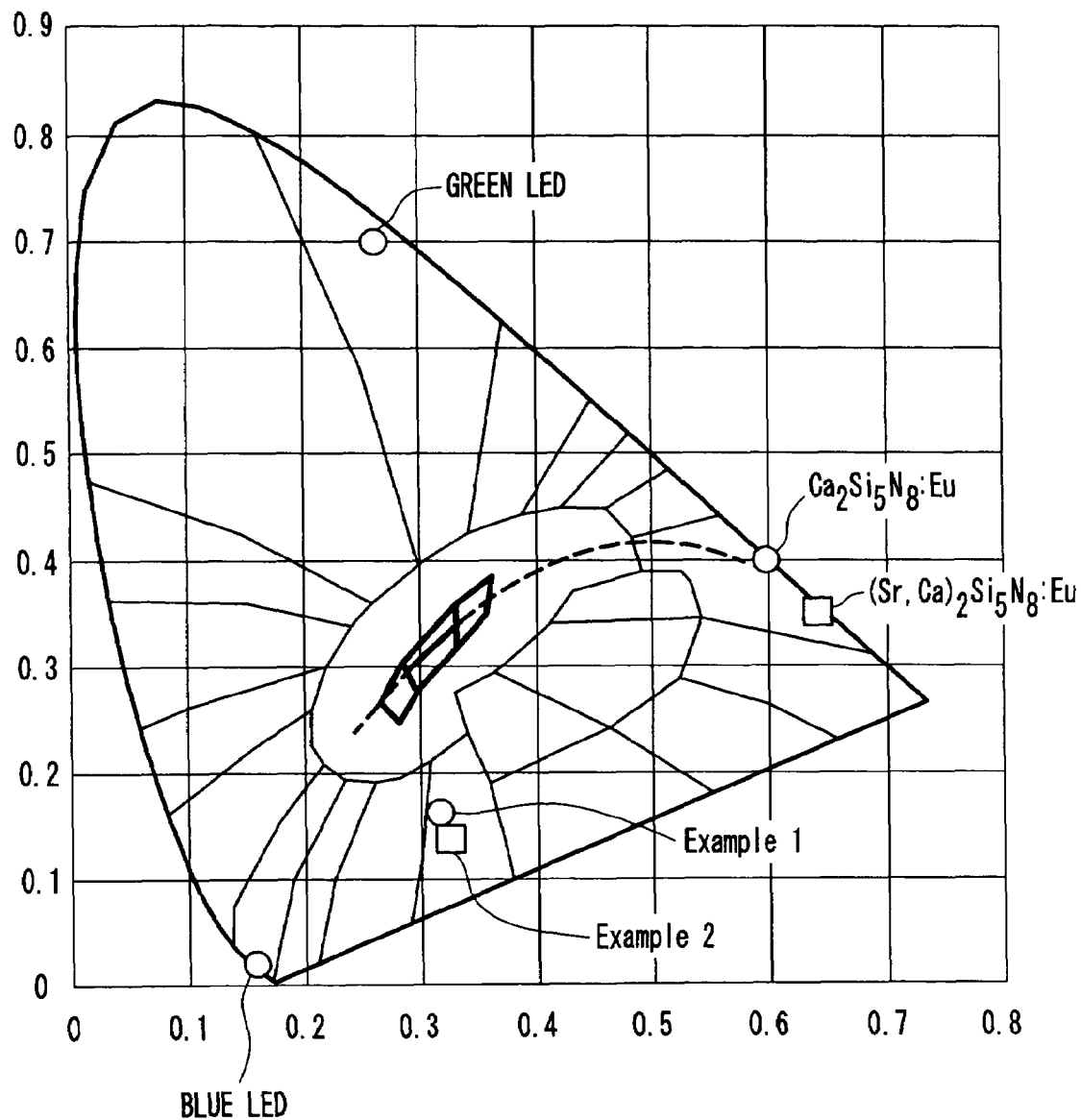
FIG. 13 is a diagram showing chromaticity coordinates of the light emitting apparatuses of the Example 1 and Example 2.

The light emitting apparatuses of Examples 1 and 2 employ the constitution of the second embodiment. FIG. 5 is a schematic perspective view of the molded package according to the second embodiment. FIG. 6 is a schematic top view of the light emitting apparatus according to the second embodiment. FIG. 7 is a schematic sectional view of the molded package according to the second embodiment. FIG. 8 is a schematic rear view of the molded package according to the second embodiment. FIG. 9 shows an excitation spectrum of the nitride fluorescent material. FIG. 10 shows an emission spectrum of the nitride fluorescent material excited by a bluish purple LED of the light emitting apparatus according to the first embodiment. FIG. 11 shows an emission spectrum of the nitride fluorescent material excited by a bluish purple LED of the light emitting apparatus according to the second embodiment. FIG. 12 shows an emission spectrum of a green LED.

The first light emitting device 108a is an ITO dice measuring 600 m square having a first peak emission wavelength of about 444 nm. The first light emitting device 108a emits bluish purple light.

The second light emitting device 108b has a second peak emission wavelength of about 533 nm. The second light emitting device 108b emits green light.

The fluorescent material 140 used in Example 1 is the nitride fluorescent material having a composition of $Ca_2Si_5N_8:Eu$. This nitride fluorescent material has a peak emission wavelength at about 609 nm. The fluorescent material 140 used in Example 2 is the nitride fluorescent material having the composition of $(Ca,Sr)_2Si_5N_8:Eu$. This nitride fluorescent material has a peak emission wavelength at about 650 nm. In the diagram, intensity of light emitted by the nitride fluorescent material used in Example 1 and Example 2 at about 444 nm, that is the first peak emission wavelength of the first light emitting device 108a, is assumed to be 100. Then the intensity of light emitted by the nitride fluorescent material used in Example 1 at about 533 nm, that is the second peak emission wavelength of the second light emitting device 108b, is about 65 and the intensity of light in Example 2 is about 74. This means that efficiency of exciting the nitride fluorescent material with the second light emitting device 108b is lower than that with the first light emitting device 108a.

The bluish purple LED and the nitride fluorescent material of Example 1 and Example 2 emit light with peak emission wavelength of about 444 nm in bluish purple region and about 609 nm in red region, but hardly emit light in the region ranging from 480 nm to 560 nm. With such a constitution that has no emission region corresponding to intermediate colors other than any of the three primary colors, the range of colors that can be produced after passing the liquid crystal can be expanded as will be described below.

Table 1 shows the results of measuring, with a predetermined integration sphere, the output of emitting light with the bluish purple LED and the nitride fluorescent material of Example 1 and Example 2. The values shown are mean values of ten samples of the light emitting apparatus (having the bluish purple LED and the nitride fluorescent material emitting) each for Example 1 and Example 2. Also shown are measurements of the second light emitting device under the same conditions, for a light emitting apparatus similar to that described above wherein only the second light emitting device (light emitting device that emits green light) is mounted. These data are also mean values of ten devices.

TABLE 1

|  | Current If (mA) | Voltage Vf (V) | Total luminous flux Φv (lm) | Emission efficiency (lm/W) | Optical output Φe (uW) | Color tone x | Color tone y | Peak wavelength λp (nm) |
|---|---|---|---|---|---|---|---|---|
| Example 1 | 100 | 3.8 | 5819 | 15.3 | 38086 | 0.316 | 0.163 | 444 |
| Example 2 | 100 | 3.8 | 3913 | 10.4 | 39117 | 0.324 | 0.139 | 444 |
| Green LED | 100 | 3.5 | 17017 | 48 | 30051 | 0.261 | 0.700 | 533 |

Thus the light emitting apparatus capable of emitting light of a predetermined color tone can be provided. The color tone can be controlled by adjusting the amount of the fluorescent material 140 as well as controlling the current supplied.

Then a predetermined current is supplied to the light emitting apparatuses (having the bluish purple LED and the nitride fluorescent material emitting) of Example 1 and Example 2. Table 2 shows the results of measuring, with a predetermined integration sphere, the output of the light emitting apparatus (having the bluish purple LED and the nitride fluorescent material emitting) for Example 1. Table 3 shows the results of measuring, with a predetermined integration sphere, the output of the light emitting apparatus (having the bluish purple LED and the nitride fluorescent material emitting) for Example 2. Table 4 shows the results of measuring the output of the second light emitting device similarly to the above with a predetermined integration sphere.

Thus light emitting apparatus capable of emitting light of a predetermined color tone over a wide range of colors displayed after passing a liquid crystal can be provided. The light emitting apparatuses (having the bluish purple LED and the nitride fluorescent material emitting) of Example 1 and Example 2, in particular, experience less color deviation even when the current supply is changed, and are capable of maintaining the predetermined light color. The present invention is very useful, since a light emitting apparatus that employs 3-wavelength light emitting device experiences color deviation depending on the current supply and the ambient temperature.

It should be noted, however, that the color tone can be controlled by means of the currents supplied to the first light emitting device and the second light emitting device, or by adjusting the amount of the fluorescent material used.

Figure 14:
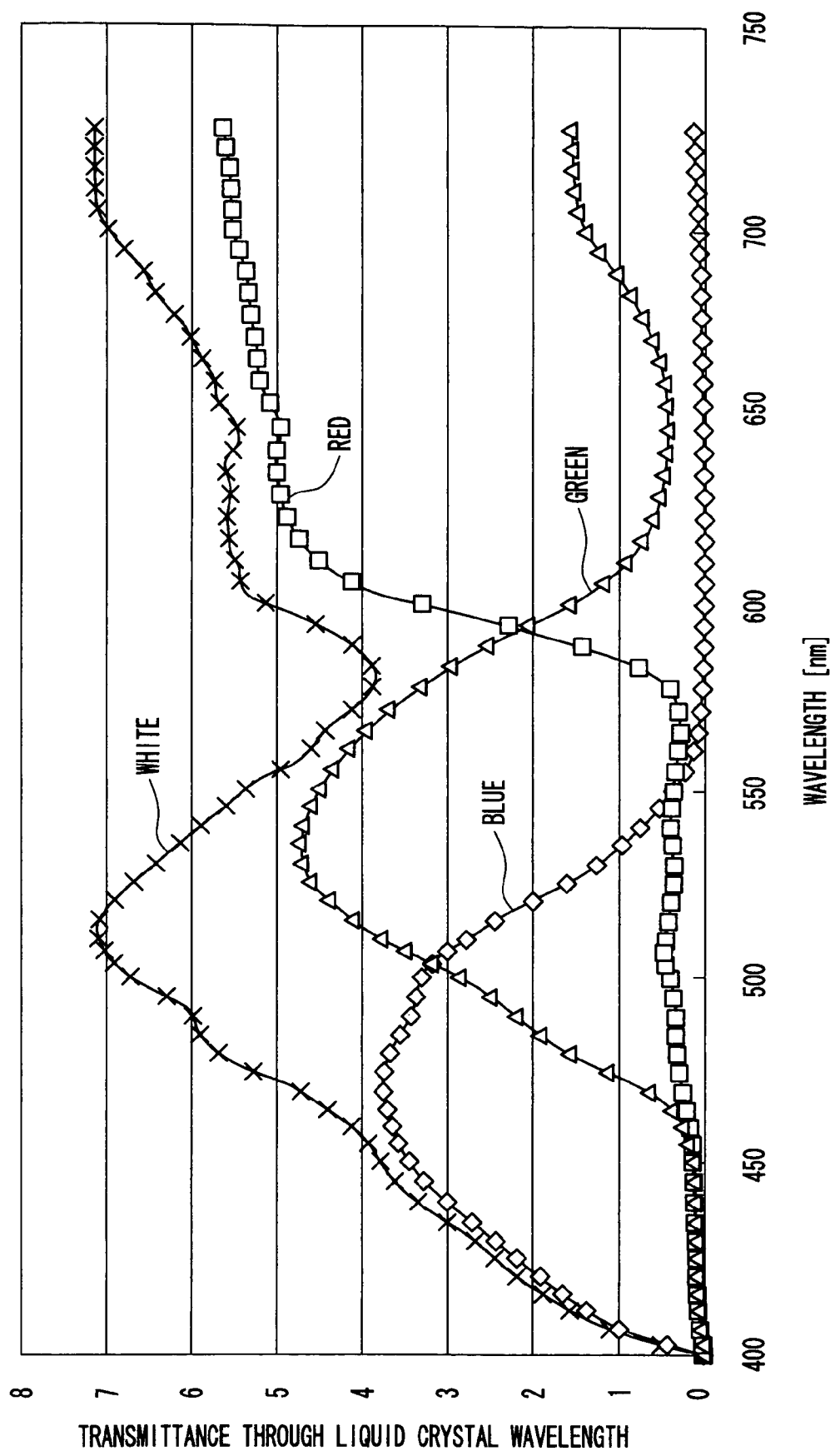
FIG. 14 is a diagram showing the transmittance of ordinary liquid crystal.

A backlight source for liquid crystal is used to extract light of only a desired wavelength by using a predetermined filter. FIG. 14 shows the transmittance of ordinary liquid crystal for

TABLE 2

| Example 1 | Current If (mA) | Voltage Vf (V) | Total luminous flux Φv (lm) | Emission efficiency (lm/W) | Optical output Φe (uW) | Color tone x | Color tone y | Peak wavelength λp (nm) |
|---|---|---|---|---|---|---|---|---|
|  | 50 | 3.6 | 3078 | 16.9 | 20046 | 0.318 | 0.163 | 445 |
|  | 100 | 4 | 5748 | 14.2 | 37216 | 0.319 | 0.164 | 445 |
|  | 150 | 4.3 | 8082 | 12.4 | 52509 | 0.318 | 0.164 | 444 |
|  | 200 | 4.6 | 10310 | 11.2 | 66837 | 0.319 | 0.164 | 443 |

TABLE 3

| Example 2 | Current If (mA) | Voltage Vf (V) | Total luminous flux Φv (lm) | Emission efficiency (lm/W) | Optical output Φe (uW) | Color tone x | Color tone y | Peak wavelength λp (nm) |
|---|---|---|---|---|---|---|---|---|
|  | 50 | 3.6 | 2123 | 12 | 21461 | 0.322 | 0.137 | 444 |
|  | 100 | 3.9 | 3889 | 9.9 | 39088 | 0.322 | 0.137 | 444 |
|  | 150 | 4.2 | 5543 | 8.8 | 55599 | 0.323 | 0.137 | 444 |
|  | 200 | 4.5 | 7045 | 7.9 | 70711 | 0.323 | 0.137 | 444 |

TABLE 4

| Green LED | Current If (mA) | Voltage Vf (V) | Total luminous flux Φv (lm) | Emission efficiency (lm/W) | Optical output Φe (uW) | Color tone x | Color tone y | Peak wavelength λp (nm) |
|---|---|---|---|---|---|---|---|---|
|  | 50 | 3.2 | 10369 | 64 | 17972 | 0.273 | 0.694 | 535 |
|  | 100 | 3.5 | 17210 | 48.6 | 30225 | 0.26 | 0.7 | 532 |
|  | 150 | 3.8 | 22744 | 40.3 | 40803 | 0.252 | 0.703 | 532 |
|  | 200 | 4 | 27441 | 34.7 | 49742 | 0.245 | 0.706 | 531 | blue, green, red and white filters. When predetermined light is passed through a blue filter, component of light in red region (wavelengths longer than about 580 nm) hardly transmits, while the transmitted light consists mainly of blue light of wavelengths around 460 nm. When predetermined light is passed through a green filter, components of light in bluish purple region and red region (wavelengths shorter than about 460 nm and wavelengths longer than about 600 nm) hardly transmit, while the transmitted light consists mainly of green light of wavelengths around 580 nm. The transmission spectrum of the blue filter and the transmission spectrum of the green filter have an overlapping portion (from about 460 nm to about 560 nm). When a blue LED ($\lambda$p=460 nm) and a YAG fluorescent material are used, the YAG fluorescent material has a broad emission spectrum and emits light that has component around 500 nm. When a backlight source for liquid crystal is constituted from the blue LED and the YAG fluorescent material provided with the filters of different colors, the output light does not include emission peaks of three primary colors of blue, green and red, and therefore has a narrow range of colors displayed after passing through the liquid crystal. That is, since the blue LED and the YAG fluorescent material emit light in the overlapping portion (intermediate region, for example around 500 nm) of the transmission spectra of the filters of different colors, component of light in the overlapping portion passes through the filters and narrows the range of colors displayed. In contrast, since the blue LED, green LED and the red fluorescent material of the present invention hardly emit light in the overlapping portion (for example, around 500 nm) of the transmission spectra of the filters of different colors, a wider range of colors displayed after passing through the liquid crystal can be provided than in the case of using the blue LED and the YAG fluorescent material. While the backlight source for liquid crystal employs three light emitting devices that emit light of the three primary colors since it enables it to expand the range of colors displayed after passing through the liquid crystal, temperature characteristic of the light emitting device that emits red light is not good and may result in color deviation. Also use of three light emitting devices that emit light of the three primary colors makes it complicated to control driving of the light emitting devices, and results in poor color rendering properties. The present invention, in contrast, provides the light emitting apparatus that experiences very little color deviation and makes it easy to control driving of the light emitting devices.

Example 3

The light emitting apparatus of Example 3 is based on the light emitting apparatus according to the second embodiment.

The first light emitting device 108a is a GaN-based semiconductor light emitting device having a first peak emission wavelength at around 460 nm. The first light emitting device 108a emits blue light.

The second light emitting device 108b has a second peak emission wavelength at around 533 nm. The second light emitting device 108b emits green light.

The fluorescent material 140 is a nitride fluorescent material having the composition of $(Ca,Sr)_2Si_5N_8$:Eu that has a peak emission wavelength at about 650 nm. Also rare earth element aluminate fluorescent material having composition of $(Y,Gd)_3Al_5O_{12}$:Ce that emits yellow light is used. The rare earth element aluminate fluorescent material is excited by light emitted by the first light emitting device 2a. The nitride fluorescent material and the rare earth element aluminate fluorescent material are mixed substantially uniformly in the light-transmitting resin 4. The fluorescent material may undergo sedimentation depending on the extent of dispersion and specific gravity of the fluorescent material.

The light emitting apparatus of Example 3 emits light of a desired color by blending blue light from the first light emitting device 108a, green light from the second light emitting device 108b, red light from the nitride fluorescent material and yellow light from the rare earth element aluminate fluorescent material. This light emitting apparatus has red component and therefore has high color rendering properties. It is also made possible to provide the light emitting apparatus that hardly experiences color deviation.

Example 4

The light emitting apparatus of Example 4 is based on the light emitting apparatus according to the second embodiment.

The first light emitting device 108a is a GaN-based semiconductor light emitting device having a first peak emission wavelength at around 380 nm. The first light emitting device 108a emits in the ultraviolet region and is almost invisible.

The second light emitting device 108b has a second peak emission wavelength at around 630 nm. The second light emitting device 108b emits red light.

The fluorescent material 140 employs alkali earth element halogen apatite fluorescent material having the composition of $(Sr,Ca)_5(PO_4)_3Cl$:Eu that emits blue light and rare earth element aluminate fluorescent material having the composition of $(Y,Gd)_3(Al,Ga)_5O_{12}$:Ce that emits yellowish green light. The alkali earth element halogen apatite fluorescent material is excited by light emitted by the first light emitting device 108a and emits blue light. The blue light emitted by the alkali earth element halogen apatite fluorescent material excites the rare earth element aluminate fluorescent material that in turn emits yellowish green light.

This constitution makes the light emitting apparatus that blends blue light from the alkali earth element halogen apatite fluorescent material, yellowish green light from the aluminate fluorescent material and red light from the second light emitting device 108b so as to emit white light. Since the color of light emitted by this light emitting apparatus hardly changes even when the peak emission wavelength of the first light emitting device 108a shifts, the light emitting apparatus that experiences less color deviation is provided.

Example 5

The light emitting apparatus of Example 5 is based on the light emitting apparatus according to the second embodiment.

The first light emitting device 108a is a GaN-based semiconductor light emitting device having a first peak emission wavelength at around 380 nm. The first light emitting device 108a emits in the ultraviolet region and is almost invisible.

The second light emitting device 108b is a GaN-based semiconductor light emitting device that has a second peak emission wavelength at around 533 nm. The second light emitting device 108b emits green light.

The fluorescent material 140 employs alkali earth element halogen apatite fluorescent material having the composition of $(Sr,Ca)_5(PO_4)_3Cl$:Eu that emits blue light and nitride fluorescent material having the composition of $Ca_2Si_5N_8$:Eu that emits red light. The nitride fluorescent material is excited by light emitted by the first light emitting device 108a and the light from the alkali earth element halogen apatite fluorescent material, so as to emit red light.

This constitution makes the light emitting apparatus that experiences less color deviation and has high color rendering properties.

Example 6

The light emitting apparatus of Example 6 is based on the light emitting apparatus according to the first embodiment.

The first light emitting device 2a and the first fluorescent material 6a are placed in the one of the recesses. The second light emitting device 2b and the second fluorescent material 6b are placed in the other recess.

The first light emitting device 2a is a GaN-based semiconductor light emitting device having a first peak emission wavelength at around 400 nm. The first light emitting device 2a emits in the short wavelength region of the visible light and is almost unrecognizable to the visual sense. The first fluorescent material 6a is nitride fluorescent material having the composition of $Ca_2Si_5N_8$:Eu that emits red light. The nitride fluorescent material is excited by the light emitted by the first light emitting device 2a and efficiently emits red light.

The second light emitting device 2b is a GaN-based semiconductor light emitting device that has a second peak emission wavelength at around 460 nm. The second light emitting device 2b emits blue light. The second fluorescent material 6b is rare earth element aluminate fluorescent material having the composition of $(Y,Gd)_3(Al,Ga)_5O_{12}$:Ce that emits yellowish green light. The rare earth element aluminate fluorescent material is excited by the light emitted by the second light emitting device 2b and efficiently emits yellowish green light.

This constitution makes the light emitting apparatus that experiences less color deviation and has high color rendering properties.

The light emitting apparatus of the present invention can be used as the backlight source for liquid crystal, illumination apparatus, light source for computer display, flash light for camera, ancillary light source for movie picture or the like.

What is claimed is:

1. A light emitting apparatus comprising;
a first light emitting device that has a first peak emission wavelength in a short wavelength region of visible light,
a fluorescent material that converts light emitted by the first light emitting device to light of a different wavelength and,
a second light emitting device that has a second peak emission wavelength which is longer than the first peak emission wavelength and is shorter than the peak emission wavelength of the fluorescent material, wherein the difference between the first peak emission wavelength and the second peak emission wavelength is 60 nm or larger, and
wherein the light emitted by the first light emitting device, the light emitted by the fluorescent material and the light emitted by the second light emitting device are mixed and emitted to the outside,
wherein said first light emitting device is mounted in a first recess and said second light emitting device is mounted in a second recess, and
wherein
a first line that perpendicularly passes a bottom surface of said first recess at its center, and
a second line that perpendicularly passes said bottom surface at the intersect of a third line that extends along a linear portion one of the side faces of said first recess and a fourth line that extends along a linear portion of another one of the side faces of said first recess,
are offset from each other such that said mixed light has a uniform color.

2. The light emitting apparatus according to claim 1,
wherein the fluorescent material is a nitride fluorescent material that contains at least one kind of group II element selected from the group consisting of Be, Mg, Ca, Sr, Ba and Zn, at least one kind of group IV element selected from the group consisting of C, Si, Ge, Sn, Ti, Zr and Hf, and element N, and is activated with at least one kind of rare earth element selected from among the group consisting of Y, La, Ce, Pr, Nd, Sm, Eu, Gd, Tb, Dy, Ho, Er and Lu.

3. The light emitting apparatus according to claim 1,
wherein the fluorescent material is excited mainly by the light emitted by the first light emitting device while being complementarily excited by the light emitted by the second light emitting device, so that the fluorescent material produces such an emission spectrum, when excited by the light from the first light emitting device, as the light intensity consists of 100 parts attributable to the light of the first peak emission wavelength emitted by the first light emitting device and 80 parts attributable to the light of the second peak emission wavelength emitted by the second light emitting device.

4. The light emitting apparatus according to claim 1, wherein the openings of said first and second recesses are formed in elliptical shapes arranged side by side along their major axes.

5. The light emitting apparatus according to claim 4, wherein the major axis of at least one of said elliptical shapes is twice as long as the minor axis of said elliptical shape.

6. A light emitting apparatus comprising;
a first light emitting device that has a first peak emission wavelength in a short wavelength region of visible light,
a fluorescent material that converts light emitted by the first light emitting device to light of a different wavelength and,
a second light emitting device that has a second peak emission wavelength which is longer than the first peak emission wavelength and is shorter than the peak emission wavelength of the fluorescent material, wherein the difference between the first peak emission wavelength and the second peak emission wavelength is 60 nm or larger, and
wherein the light emitted by the first light emitting device, the light emitted by the fluorescent material and the light emitted by the second light emitting device are mixed and emitted to the outside,
wherein said first light emitting device is mounted in a first recess and said second light emitting device is mounted in a second recess, and
wherein
a first line that perpendicularly passes a bottom surface of said first recess at its center, and
a second line that perpendicularly passes said bottom surface at the intersect of a third line that extends along a linear portion of one of the side faces of said first recess and a fourth line that extends along a linear portion of another one of the side faces of said first recess,
are situated with respect to each other such that said mixed light has a uniform color.

7. The light emitting apparatus according to claim 6, wherein the openings of said first and second recesses are formed in elliptical shapes different from circles, said elliptical shapes being arranged side by side along their major axes.

* * * * *

UNITED STATES PATENT AND TRADEMARK OFFICE
CERTIFICATE OF CORRECTION

| | | |
|---|---|---|
| PATENT NO. | : 7,569,987 B2 | Page 1 of 1 |
| APPLICATION NO. | : 11/213860 | |
| DATED | : August 4, 2009 | |
| INVENTOR(S) | : Takahiro Naitou | |

It is certified that error appears in the above-identified patent and that said Letters Patent is hereby corrected as shown below:

In Claim 1, at column 23, line 67, insert --of-- between "portion" and "one of".

Signed and Sealed this

Sixth Day of April, 2010

David J. Kappos
*Director of the United States Patent and Trademark Office*